(12) United States Patent
Kawafuji et al.

(10) Patent No.: US 6,794,742 B2
(45) Date of Patent: Sep. 21, 2004

(54) INVERTER MODULE HAVING A PLURALITY OF TERMINALS AT A PREDETERMINED PITCH

(75) Inventors: Hisashi Kawafuji, Fukuoka (JP); Toru Iwagami, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 42 days.

(21) Appl. No.: 10/106,443

(22) Filed: Mar. 27, 2002

(65) Prior Publication Data

US 2003/0006434 A1 Jan. 9, 2003

(30) Foreign Application Priority Data

Jul. 3, 2001 (JP) ........................................ 2001-202153

(51) Int. Cl.$^7$ .............................................. H01L 23/48
(52) U.S. Cl. ...................................... 257/690; 257/692
(58) Field of Search ................................. 257/666, 667, 257/668, 669, 670, 671, 672, 673, 674, 675, 676, 677, 678, 687, 688, 689, 690, 691, 692, 693, 694, 695, 696, 697, 698, 699, 723, 724, 725, 726

(56) References Cited

U.S. PATENT DOCUMENTS

| | | | |
|---|---|---|---|
| 4,934,820 A | * | 6/1990 | Takahashi et al. |
| 5,239,198 A | * | 8/1993 | Lin et al. |
| 5,442,229 A | * | 8/1995 | Mori et al. |
| 5,773,883 A | * | 6/1998 | Majumdar et al. |
| 6,323,545 B1 | | 11/2001 | Michii |

FOREIGN PATENT DOCUMENTS

| | | | |
|---|---|---|---|
| JP | WO-9918610 A1 | * | 4/1999 |
| JP | 2000-138343 | | 5/2000 |
| JP | 20000138343 A | * | 5/2000 |

* cited by examiner

*Primary Examiner*—Nathan J. Flynn
*Assistant Examiner*—Kevin Quinto
(74) *Attorney, Agent, or Firm*—Oblon, Spivak, McClelland, Maier & Neustadt, P.C.

(57) ABSTRACT

An inverter module includes a plurality of leads arranged according to a ZIP. A lead ($101_U$, $101_V$, $101_W$) serving as a load side output terminal and a lead ($104_U$, $104_V$, $104_W$) serving as a high-potential side control input terminal are bent toward directions opposite to each other. A lead ($107_U$, $107_V$, $107_W$) serving as a low-potential side control input terminal is arranged at a distance four times a terminal pitch from the lead serving as the load side output terminal ($101_U$, $101_V$, $101_W$).

17 Claims, 24 Drawing Sheets

F I G . 1
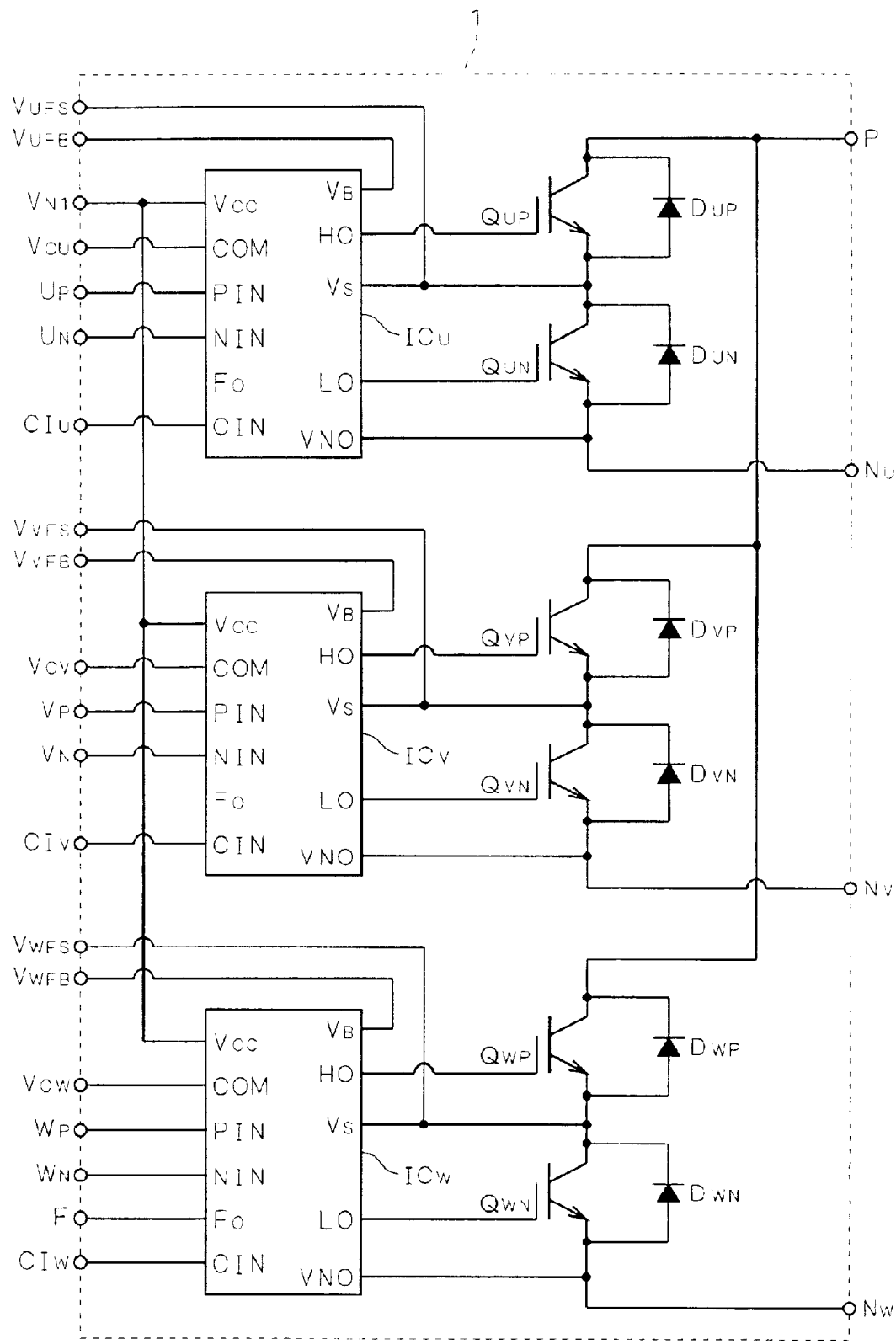

F I G . 2
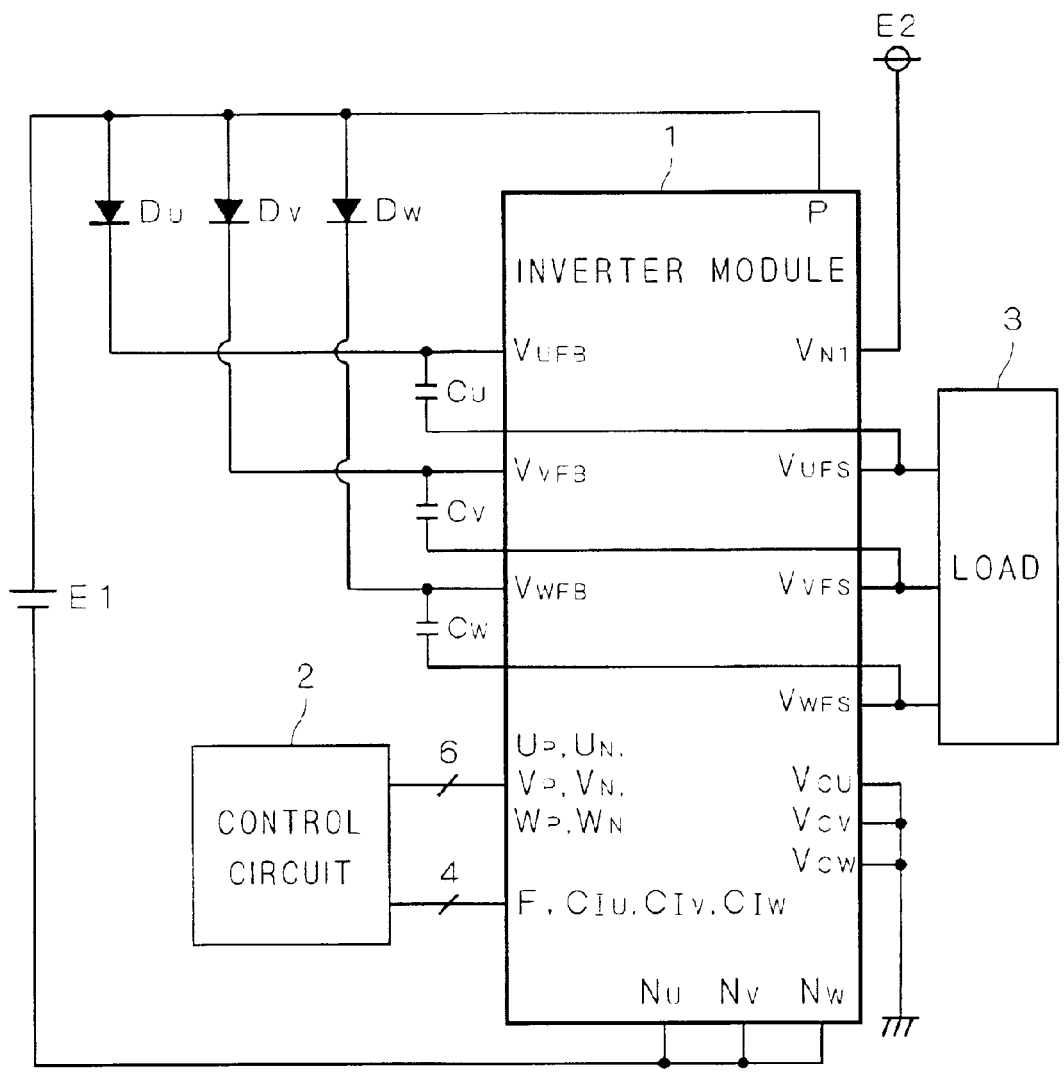

F I G . 12
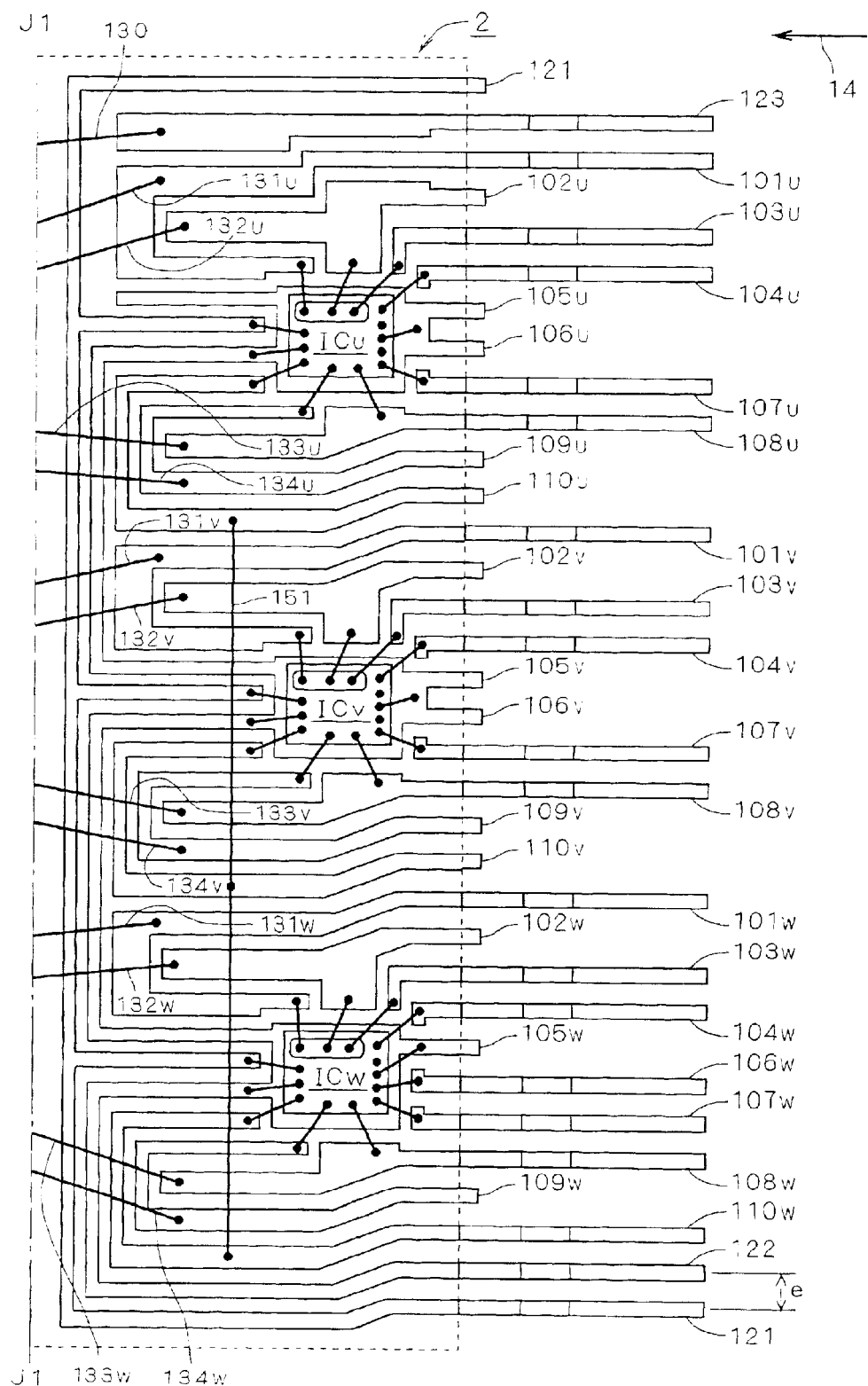

INVERTER MODULE HAVING A PLURALITY OF TERMINALS AT A PREDETERMINED PITCH

BACKGROUND OF THE INVENTION

1. Field of the Invention

The present invention is applicable to a semiconductor device and more particularly, to a semiconductor device as a module including a transistor for constituting an inverter and an integrated circuit for controlling the transistor, for example.

2. Description of the Background Art

FIG. 24 is a circuit diagram exemplifying the structure of a power module 501 for driving inverter (hereinafter referred to simply as "inverter module") in the background art. The inverter module 501 includes six insulated gate bipolar transistors (hereinafter referred to simply as "transistor") constituting an inverter and switching control circuits HVIC1, HVIC2, HVIC3, LVIC. The switchings of the three out of the six transistors arranged on the side of upper arms are controlled by the switching control circuits HVIC1, HVIC2 and HVIC3. The switchings of the three arranged on the side of lower arms are controlled by the switching control circuit LVIC.

FIG. 25 is an outline view illustrating arrangement of pins of the inverter module 501. In FIG. 25, the pins are respectively designated in conformity with the terminals illustrated in FIG. 24. Pins 502d, 502f are arranged on one side and pins 502b are arranged on the other side. The pins 502d are connected to a control circuit not shown, and the pins 502b are connected to a load and power source not shown. The pins 502f are not required to have connection to any one of the control circuit, load or power source. Rather, each pin 502f serves as an intermediary for connection in the inverter module. The example of this configuration is introduced in Japanese Patent Application Laid-Open No. 2000-138343, for example.

A bootstrap voltage is applied across each bootstrap input end $V_B$ and load side output end $V_S$ of the switching control circuits HVIC1, HVIC2 and HVIC3. The bootstrap voltage is set to be 600 bolts, for example. As a result, terminals $V_{UFB}$, $V_{UFS}$, $V_{VFB}$, $V_{VFS}$, $V_{WFB}$ and $V_{WFS}$ each connected to the bootstrap input end $V_B$ or the load side output end $V_S$ also receive voltage of about 600 volts applied thereto. In contrast, each of the other terminals receives voltage that is on the order, at most, of 15 volts.

Therefore, creepage distance between each of the terminals $V_{UFB}$, $V_{UFS}$, $V_{VFB}$, $V_{VFS}$, $V_{WFB}$, $V_{WFS}$ and each of the other terminals should be increased in terms of insulation. In view of this, the inverter module 501 includes recessed portions 503 provided between each of the terminals $V_{UFB}$, $V_{UFS}$, $V_{VFB}$, $V_{VFS}$, $V_{WFB}$, $V_{WFS}$ and each of the other terminals.

However, a pair of the terminals $V_{UFB}$, $V_{UFS}$, a pair of terminals $V_{VFB}$, $V_{VFS}$, a pair of terminals $V_{WFB}$, $V_{WFS}$ and the other terminals are alternately arranged, thereby requiring a large number of recessed portions 503. This is one of the obstacles to downsizing.

When the inverter module 501 is mounted on a substrate, further, an interconnection pattern receiving a relatively high voltage and an interconnection pattern receiving a relatively low voltage are likely to be mixed on the substrate. This may result in the undesirable increase in inductance that is parasitic on the interconnection pattern.

SUMMARY OF THE INVENTION

A first aspect of the present invention is directed to an inverter module comprising a plurality of terminals arranged along a first direction at a predetermined terminal pitch and the plurality of terminals form a plurality of rows. In the inverter module according to the first aspect, the plurality of terminals include at least one load side output terminal, the plurality of terminals include at least one high-potential side control input terminal and at least one low-potential side control input terminal, each of the at least one load side output terminal is bent to extend toward a second direction orthogonal to the first direction, and both the at least one high-potential side control input terminal and the at least one low-potential side control input terminal satisfy at least either one of first and second conditions. The first condition requires bending and extending toward a third direction opposite to the second direction and the second condition requires having distance of three times the terminal pitch or more from the at least one load side output terminal.

According to a second aspect of the present invention, in the inverter module according to the first aspect, both the at least one high-potential side control input terminal and the at least one low-potential side control input terminal satisfy the first condition.

According to a third aspect of the present invention, in the inverter module according to the first aspect, the at least one high-potential side control input terminal includes a plurality of high-potential side control input terminals, and each of the plurality of high-potential side control input terminals satisfies the first condition.

According to a fourth aspect of the present invention, in the inverter module according to the first aspect, the at least one low-potential side control input terminal includes a plurality of low-potential side control input terminals, and each of the plurality of low-potential side control input terminals satisfies the second condition.

According to a fifth aspect of the present invention, in the inverter module according to the first aspect, the at least one load side output terminal includes a plurality of load side output terminals.

According to a sixth aspect of the present invention, in the inverter module according to the first aspect, the plurality of terminals further include at least one bootstrap input terminal that is bent to extend toward a direction orthogonal to the first direction, and both the at least one high-potential side control input terminal and the at least one low-potential side control input terminal satisfy at least either one of third and fourth conditions as follows. The third condition requires bending and extending toward a direction opposite to the direction toward which the at least one bootstrap input terminal is bent to extend and the fourth condition requires having distance of three times the terminal pitch or more from the at least one bootstrap input terminal.

According to a seventh aspect of the present invention, in the inverter module according to the sixth aspect, both the at least one high-potential side control input terminal and the at least one low-potential side control input terminal satisfy the third condition.

According to an eighth aspect of the present invention, in the inverter module according to the sixth aspect, the at least one bootstrap input terminal includes a plurality of bootstrap input terminals.

According to a ninth aspect of the present invention, in the inverter module according to the sixth aspect, the at least one high-potential side control input terminal includes a plurality of high-potential side control input terminals, and each of the plurality of high-potential side control input terminals satisfies the third condition.

According to a tenth aspect of the present invention, in the inverter module according to the first aspect, the plurality of terminals further include at least one high-potential side control output terminal arranged between the at least one low-potential side control input terminal and the at least one load side output terminal, and a tip of the at least one high-potential side control output terminal is cut to a length shorter than tips of both the at least one high-potential side control input terminal and the at least one low-potential side control input terminal.

According to an eleventh aspect of the present invention, in the inverter module according to the tenth aspect, the at least one low-potential side control input terminal includes a plurality of low-potential side control input terminals, and each of the plurality of low-potential side control input terminals satisfies the second condition.

According to a twelfth aspect of the present invention, the inverter module according to the first aspect further comprises inverters provided in response to at least one phase. In the inverter module according to the twelfth aspect, the plurality of terminals further include a high-potential side power source terminal connected to each of the inverters and at least one low-potential side power source terminal connected to each of the inverters, and both the high-potential side power source terminal and the at least one low-potential side power source terminal satisfy the first condition.

According to a thirteenth aspect of the present invention, in the inverter module according to the tenth aspect, the at least one low-potential side power source terminal is a single terminal connected to each of the inverters, and the high-potential side power source terminal and the single terminal are arranged adjacent to each other.

According to a fourteenth aspect of the present invention, the inverter module according to the thirteenth aspect further comprises a switching control circuit for controlling switching of one of the inverters. In the inverter module according to the fourteenth aspect, the plurality of terminals further include a short-circuit detecting terminal connected to a short-circuit detecting end of the switching control circuit and a ground terminal connected to a ground end of the switching control circuit, and the short-circuit detecting terminal and the ground terminal are arranged adjacent to each other.

According to a fifteenth aspect of the present invention, the inverter module according to the first aspect further comprises a plurality of switching control circuits respectively provided in response to a plurality of phases. In the inverter module according to the fifteenth aspect, the plurality of terminals further include a ground terminal for establishing mutual connection between each ground end of the plurality of switching control circuits.

According to a sixteenth aspect of the present invention, the inverter module according to the first aspect further comprises a plurality of switching control circuits respectively provided in response to a plurality of phases. In the inverter module according to the sixteenth aspect, the plurality of terminals further include a short-circuit detecting terminal for establishing mutual connection between each short-circuit detecting end of the plurality of switching control circuits.

According to the inverter module of the first through fourth aspects of the present invention, when the first condition is satisfied, creepage distance is increased between the positions receiving high voltage applied thereto on a substrate having connection to the ends of the plurality of terminals. When the second condition is satisfied, creepage distance is increased as well between these positions at the bottoms of the plurality of terminals on the side of a semiconductor device.

According to the inverter module of the fifth aspect of the present invention, each of the plurality of load side output terminals is bent to extend toward the second direction. As a result, on a substrate for holding the inverter module mounted thereon, interconnection between the load side output terminal and a load is facilitated.

According to the inverter module of the sixth through ninth aspects of the present invention, when the third condition is satisfied, creepage distance is increased between the positions receiving high voltage applied thereto on the substrate having connection to the ends of the plurality of terminals. When the fourth condition is satisfied, creepage distance is increased as well between these positions at the bottoms of the plurality of terminals on the side of the semiconductor device.

According to the inverter module of the tenth and eleventh aspects of the present invention, a distance between the low-potential side control input terminal and the load side output terminal can be three times the terminal pitch or more. Further, the tip of the high-potential side control output terminal is cut to a short length. As a result, on the substrate for holding the inverter module mounted thereon, it is possible to secure creepage distance.

According to the inverter module of the twelfth aspect of the present invention, both the high-potential side power source terminal and the low-potential side power source terminal to be connected to the inverter are bent to extend toward the third direction. As a result, on the substrate for holding the inverter module mounted thereon, interconnection between these terminals and a power source for supplying power to the inverter is facilitated.

According to the inverter module of the thirteenth aspect of the present invention, on the substrate for holding the inverter module mounted thereon, the lengths of interconnect lines for establishing connections to the power source for supplying power to the inverter is facilitated. As a result, reduction in inductance parasitic on these interconnect lines is realized.

According to the inverter module of the fourteenth aspect of the present invention, interconnection to an object to be connected to the short-circuit detecting terminal and the ground terminal such as a protection circuit for the short-circuit detecting terminal is simplified.

According to the inverter module of the fifteenth aspect of the present invention, even when the inverter module is applicable to the plurality of phases, the number of ground terminals and the number of terminals to be drawn to the outside are reduced.

According to the inverter module of the sixteenth aspect of the present invention, even when the inverter module is applicable to the plurality of phases, the number of short-circuit detecting terminals and the number of terminals to be drawn to the outside are reduced.

It is therefore an object of the present invention to increase creepage distance while realizing downsizing of an inverter module. It is a further object of the present invention to facilitate interconnection to a load and also to a power source.

These and other objects, features, aspects and advantages of the present invention will become more apparent from the

BRIEF DESCRIPTION OF THE DRAWINGS

FIG. 1 is a circuit diagram illustrating the internal structure of an inverter module according to a first preferred embodiment of the present invention;

FIG. 2 is a circuit diagram illustrating a driving circuit for driving a load in the first preferred embodiment of the present invention;

FIGS. 5 and 6 are combined;

FIG. 12 is a plan view illustrating the internal structure of the inverter module according to the second preferred embodiment of the present invention in combination with FIG. 5;

FIGS. 5 and 12 are combined;

FIGS. 18 and 19 are combined;

DESCRIPTION OF THE PREFERRED EMBODIMENTS

First Preferred Embodiment

Figure 3:
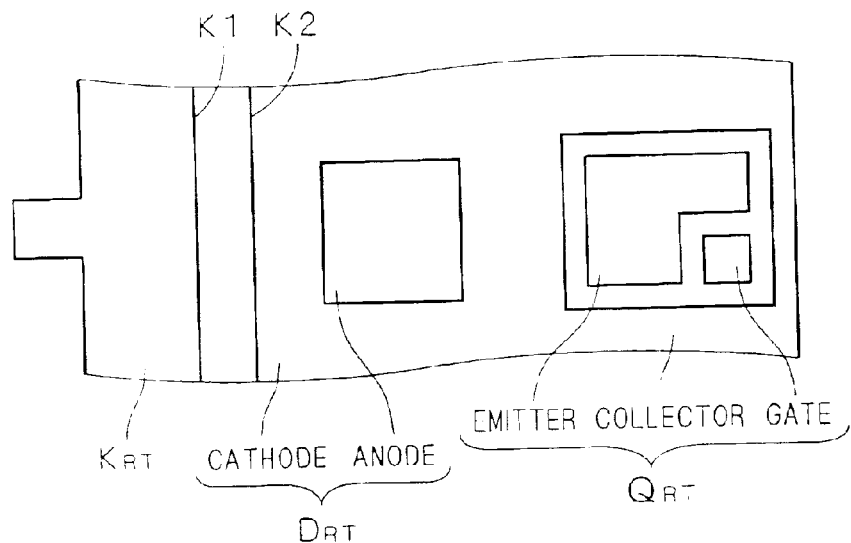
FIG. 3 is a plan view partially illustrating the structure of the inverter module according to the first preferred embodiment of the present invention.

FIG. 1 is a circuit diagram illustrating the internal structure of an inverter module 1 as a semiconductor device according to the first preferred embodiment of the present invention. The inverter module 1 constitutes a three-phase inverter including a transistor $Q_{UP}$ as a high-potential side control element in U phase, a transistor $Q_{UN}$ as a low-potential side control element in U phase, a transistor $Q_{VP}$ as a high-potential side control element in V phase, a transistor $Q_{VN}$ as a low-potential side control element in V phase, a transistor $Q_{WP}$ as a high-potential side control element in W phase and a transistor $Q_{WN}$ as a low-potential side control element in W phase.

Free-wheeling diodes $D_{UP}$, $D_{UN}$, $D_{VP}$, $D_{VN}$, $D_{WP}$ and $D_{WN}$ are provided to the transistors $Q_{UP}$, $Q_{UN}$, $Q_{VP}$, $Q_{VN}$, $Q_{WP}$ and $Q_{WN}$, respectively. A cathode and an anode of the free-wheeling diode $D_{RT}$ (R represents any one of U, V, W and T represents either one of P, N) are connected to a collector and an emitter of the transistor $Q_{RT}$, respectively. The emitter of the transistor $Q_{RP}$ and the collector of the transistor $Q_{RN}$ are connected in each phase.

The inverter module 1 further includes a switching control circuit $IC_R$ provided in response to the R phase for controlling switching of both the transistor $Q_{RP}$ and $Q_{RN}$. The switching control circuit $IC_R$ includes a high-potential side control end HO and a low-potential side control end LO respectively connected to gate electrodes of the transistor $Q_{RP}$ and $Q_{RN}$. The switching control circuit $IC_R$ further includes an inverter side ground end VNO connected to an emitter of the transistor $Q_{RN}$.

Further included in the switching control circuit $IC_R$ are a high-potential side control input end PIN and a low-potential side control input end NIN. A logic signal applied to the high-potential side control input end PIN determines logic corresponding to a potential to be applied to the high-potential side control end HO. A logic signal applied to the low-potential side control input end NIN determines logic corresponding to a potential to be applied to the low-potential side control end LO.

The switching control circuit $IC_R$ also includes a bootstrap input end $V_B$ and a load side output end $V_S$. While the bootstrap input end $V_B$ receives bootstrap voltage relative to the load side output end $V_S$, the high-potential side control end HO and the low-potential side control end LO supply voltages of proper level to the gates of the transistors $Q_{RP}$ and $Q_{RN}$, respectively. The switching of the transistor $Q_{RT}$ is performed on the basis of the voltage applied to its gate. The bootstrap voltage is set to be several hundreds of volts, for example.

Still further, the switching control circuit $IC_R$ includes a ground end COM and an operating power source end $V_{CC}$.

The switching control circuit $IC_R$ becomes operative when the operating power source end $V_{CC}$ receives operating voltage relative to the ground end COM. The operating voltage is set to be dozen or so volts, for example.

Also included in the switching control circuit $IC_R$ is a short-circuit detecting end CIN and an error detecting end $F_O$. When a short circuit and an operating error are detected, currents flow through these terminals, respectively. Resistors are connected to each of the short-circuit detecting end CIN and the error detecting end $F_O$, thereby detecting the short circuit and operating error on the basis of drop in voltage at the resistors. These resistors are provided outside the inverter module 1.

The inverter module 1 includes a plurality of terminals exposed to the outside. A high-potential side inverter power source terminal P is connected to each collector of the transistors $Q_{UP}$, $Q_{VP}$ and $Q_{WP}$. The low-potential side inverter power source terminal $N_R$ is connected to both the emitter of the transistor $Q_{RN}$ and the inverter side ground end VNO of the switching control circuit $IC_R$. A load side output terminal $V_{RFS}$ is connected to the load side output end $V_S$ of the switching control circuit $IC_R$. A bootstrap input terminal $V_{RFB}$ is connected to the bootstrap input end $V_B$ of the switching control circuit $IC_R$. A high-potential side control input terminal $R_P$ is connected to the high-potential side control input end PIN of the switching control circuit $IC_R$. A low-potential side control input terminal $R_N$ is connected to the low-potential side control input end NIN of the switching control circuit $IC_R$. A ground terminal $V_{CR}$ is connected to the ground end COM of the switching control circuit $IC_R$. An operating power source terminal $V_{N1}$ is connected to the respective operating power source ends $V_{CC}$ of the switching control circuits $IC_U$, $IC_V$ and $IC_W$. A short-circuit detecting terminal $CI_R$ is connected to the short-circuit detecting end CIN of the switching control circuit $IC_R$. An error detecting terminal F is connected to the error detecting end $F_O$ of the switching control circuit $IC_W$.

FIG. 2 is a circuit diagram illustrating a driving circuit for driving a three-phase inductive load 3 using the inverter module 1. A positive pole of a DC power source E1 is connected to the high-potential side inverter power source terminal P and a negative pole of the DC power source E1 is connected to each of the low-potential side inverter power source terminals $N_U$, $N_V$ and $N_W$. The voltage of the DC power source E1 is set to be several hundreds of volts, for example.

A bootstrap capacitor $C_R$ is interposed between the load side output terminal $V_{RFS}$ and the bootstrap input terminal $V_{RFB}$. Also provided is a diode $D_R$ having an anode connected to the high-potential side inverter power source terminal P and a cathode connected to the bootstrap input terminal $V_{RFB}$. The bootstrap capacitor $C_R$ is charged when the transistor $Q_{RN}$ is in conductive state. A voltage from the DC power source E1 is thereby applied as a bootstrap voltage to the bootstrap input end $V_B$ relative to the load side output end $V_S$ in the switching control circuit $IC_R$. The ground terminal $V_{CR}$ is grounded and a DC potential E2 having a voltage level such as several tens of volts is applied to the operating power source terminal $V_{N1}$.

A control circuit 2 is generally formed on a substrate (not shown). The control circuit 2 applies a pulse signal to the high-potential side control input terminal $R_P$ and the low-potential side control input terminal $R_N$. The pulse signal corresponds to a binary logic that changes on the basis of a predetermined pattern and the switching of the transistor $Q_{RT}$ is performed in response to the pattern of the pulse signal. The control circuit 2 has further connection to the short-circuit detecting terminal $CI_R$ and the error detecting terminal F. Based on the currents flowing therethrough, the generation of a short circuit and an operating error are detected at the short-circuit detecting terminal $CI_R$ and the error detecting terminal F, respectively.

FIG. 3 is a plan view illustrating the transistor $Q_{RT}$, the free-wheeling diode $D_{RT}$ and their vicinity. The collector of the transistor $Q_{RT}$ and the cathode of the free-wheeling diode $D_{RT}$ are both mounted on a metal plate $K_{RT}$. The emitter and the gate of the transistor $Q_{RT}$ are arranged on the side opposite to the metal plate $K_{RT}$ relative to the collector. The emitter has an L shape for surrounding the gate. The anode of the free-wheeling diode $D_{RT}$ is arranged on the side opposite to the metal plate $K_{RT}$ relative to the cathode. A bending angle of the metal plate $K_{RT}$ is represented by straight lines K1 and K2 in FIG. 3 as a plan view.

Figure 4:
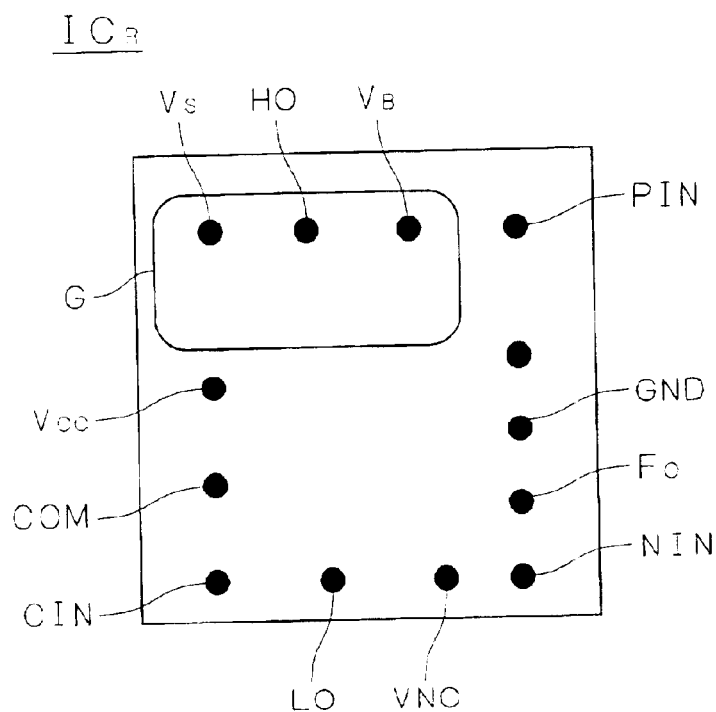
FIG. 4 is a plan view illustrating a switching control circuit according to the first preferred embodiment of the present invention.

FIG. 4 is a plan view from the same direction as FIG. 3 for illustrating placement of each terminal of the switching control circuit $IC_R$. The load side output end $V_S$, the high-potential side control end HO, the bootstrap input end $V_B$, the high-potential side control input end PIN, a ground end GND not illustrated in FIG. 1 nor in FIG. 2, the error detecting end $F_O$, the low-potential side control input end NIN, the inverter side ground end VNO, the low-potential side control end LO, the short-circuit detecting end CIN, the ground end COM and the operating power source end $V_{CC}$ are arranged in this order in a clockwise direction on the periphery of the switching control circuit $IC_R$.

In the switching control circuit $IC_R$, the bootstrap input end $V_B$, the load side output terminal $V_S$ and the high-potential side control end HO are arranged in a high-potential island surrounded by a guard ring G. This is because when the transistor $Q_{RP}$ moves into a conductive state, the load side output end $V_S$ bears potential approximately the same as the high-potential side inverter power source terminal P, thereby applying high potential that is on the order of several hundreds of volts to the high-potential side control end HO as well as to the bootstrap input end $V_B$.

Figure 5:
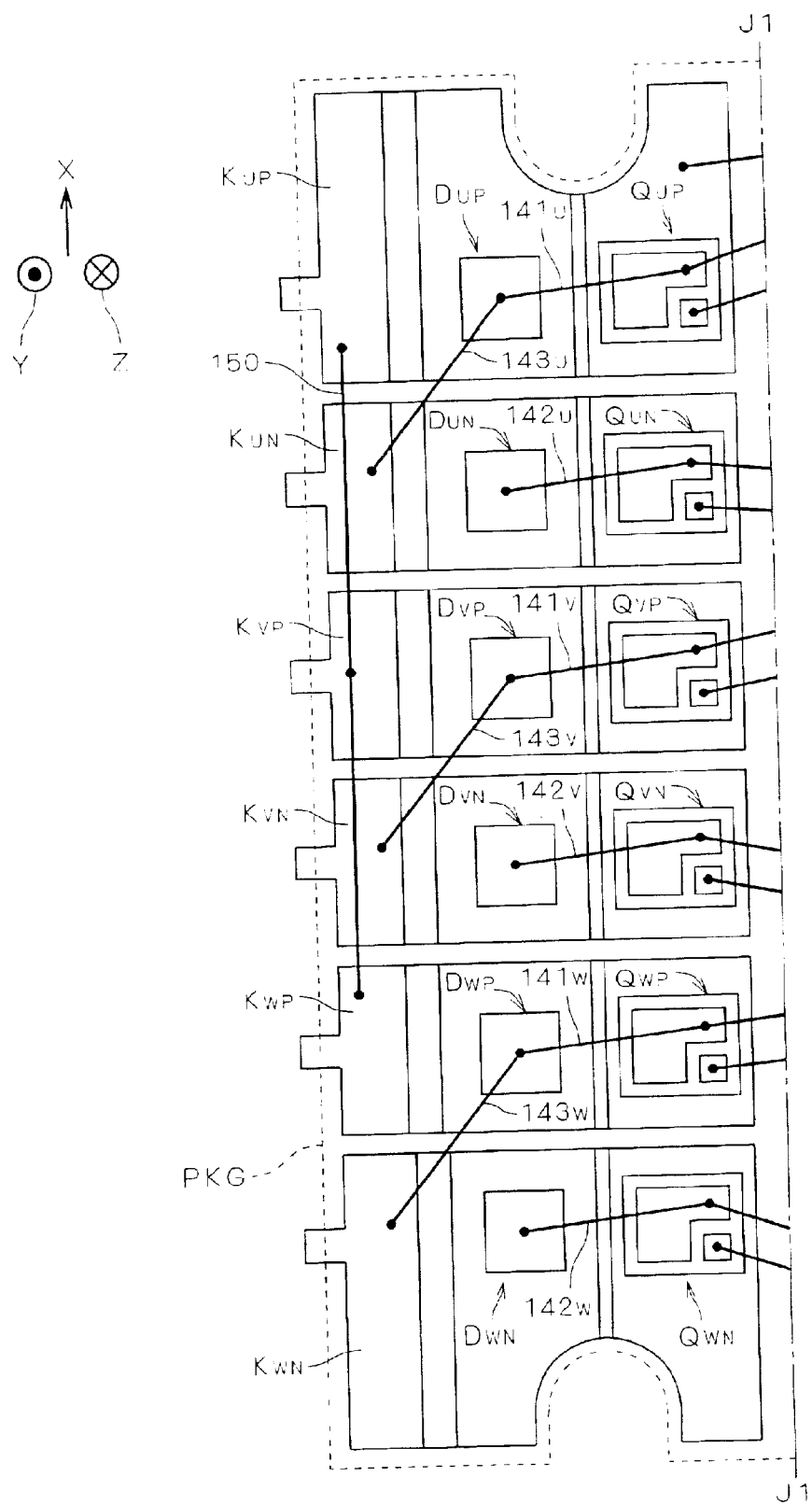
FIG. 5 is a plan view illustrating the internal structure of the inverter module according to the first preferred embodiment of the present invention in combination with FIG. 6.
Figure 6:
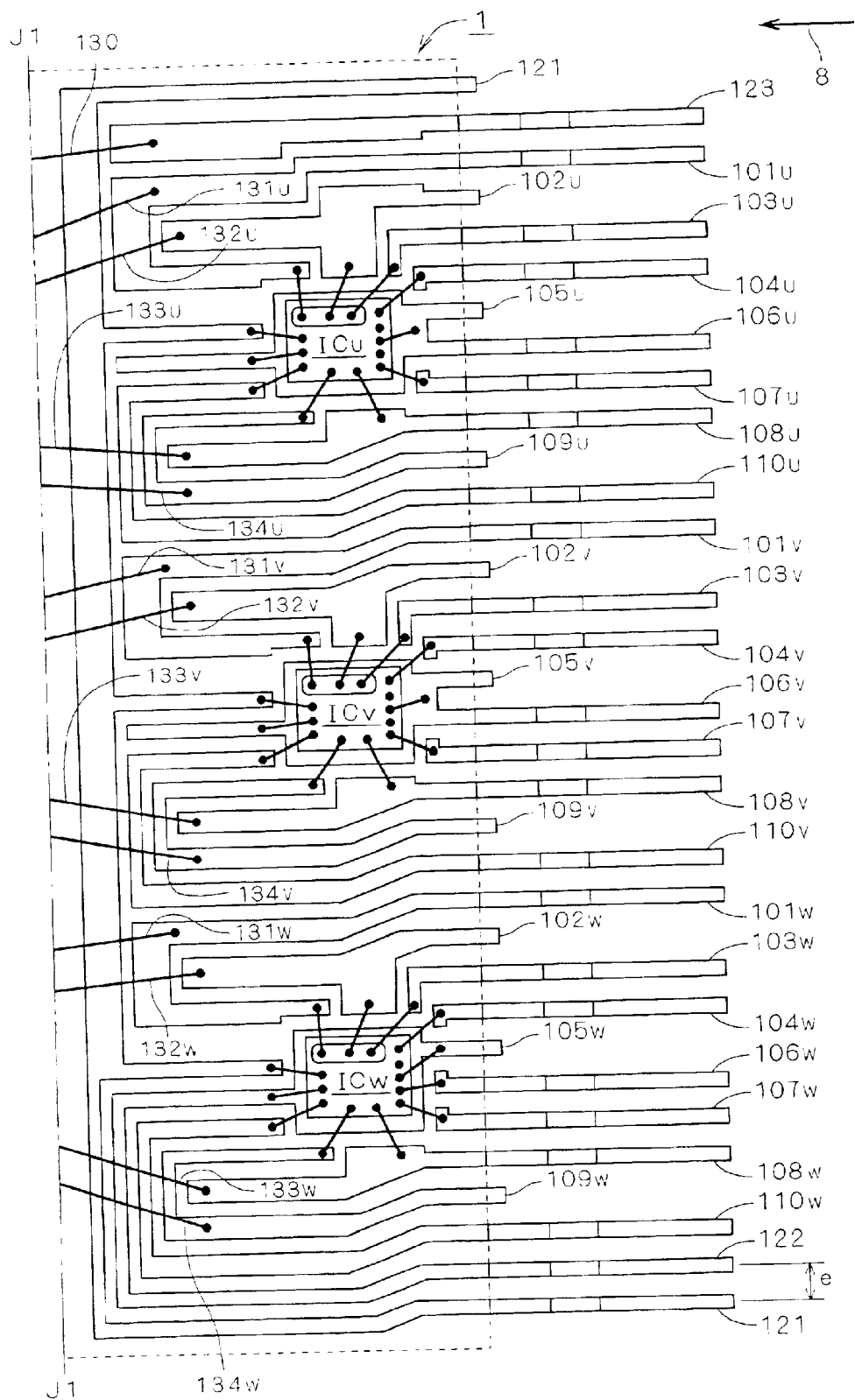
FIG. 6 is a plan view illustrating the internal structure of the inverter module according to the first preferred embodiment of the present invention in combination with FIG. 5.
Figure 7:
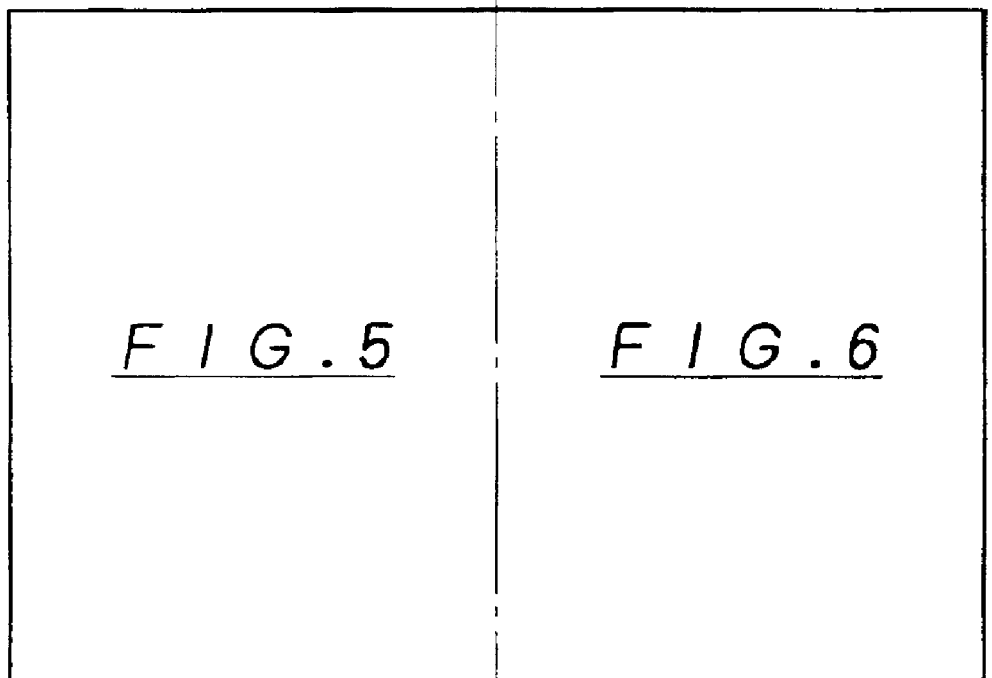
FIG. 7 is a view illustrating how

FIGS. 5 and 6 are plan views illustrating in combination the internal structure of the inverter module 1. FIG. 7 is a view illustrating how FIGS. 5 and 6 are combined. In FIG. 7, FIGS. 5 and 6 are combined by a phantom line J1J1.

The inverter module 1 includes leads $101_R$ through $110_R$, 121 through 123, the metal plate $K_{RT}$, aluminum interconnect lines 130, $131_R$ through $134_R$, $141_R$ through $143_R$, 150, the switching control circuit $IC_R$ and gold interconnect lines for connecting the switching control circuit $IC_R$ and these leads. The inverter module 1 is sealed with a resin package PKG. A lead frame (not shown) is cut and formed into the metal plate $K_{RT}$ and the leads $101_R$ through $110_R$, 121 through 123 that are originally integral with one another.

The leads $101_U$, $102_U$, $103_U$, $104_U$, $105_U$, $107_U$, $108_U$, $109_U$ and $110_U$ are respectively connected to the load side output end $V_S$, the high-potential side control end HO, the bootstrap input end $V_B$, the high-potential side control input end PIN, the ground end GND, the low-potential side control input end NIN, the inverter side ground end VNO, the low-potential side control end LO and the short-circuit detecting end CIN of the switching control circuit $IC_U$ by the gold interconnect lines. The lead $106_U$ is integrally formed with the lead $105_U$ and holds the switching control circuit $IC_U$ mounted thereon. Further, the lead $106_U$ is connected to the ground end COM of the switching control circuit $IC_U$ by the gold interconnect line.

Similar to the leads $101_U$ through $110_U$, the leads $101_V$ through $110_V$ are connected to the respective terminals of the switching control circuit $IC_V$ and hold the switching control circuit $IC_V$ mounted thereon.

The leads $101_W$, $102_W$, $103_W$, $104_W$, $105_W$, $106_W$, $107_W$, $108_W$, $109_W$ and $110_W$ are respectively connected to the load side output end $V_S$, the high-potential side control end HO, the bootstrap input end $V_B$, the high-potential side control input end PIN, the ground end GND, the error detecting end $F_O$, the low-potential side control input end NIN, the inverter side ground end VNO, the low-potential side control end LO and the short-circuit detecting end CIN of the switching control circuit $IC_W$ by the gold interconnect lines. The lead 122 is integrally formed with the lead $105_W$ and holds the switching control circuit $IC_W$ mounted thereon. Further, the lead 122 is connected to the ground end COM of the switching control circuit $IC_W$ by the gold interconnect line.

The switching control circuits $IC_W$, $IC_V$ and $IC_U$ are arranged in this order toward a first direction X. The switching control circuit $IC_R$ is so arranged that the respective terminals thereof are located at the respective positions illustrated in FIG. 4. Further, the leads $101_R$ through $110_R$ and 122 are all drawn to an outgoing direction orthogonal to the direction X that is indicated as a direction to the right in FIG. 6. The tips of the leads $101_R$ through $110_R$ in the outgoing direction are arranged in the following order toward the direction X. That is, the tips of the leads 122, $110_W$, $109_W$, $108_W$, $107_W$, $106_W$, $105_W$, $104_W$, $103_W$, $102_W$, $101_W$, $110_V$, $109_V$, $108_V$, $107_V$, $106_V$, $105_V$, $104_V$, $103_V$, $102_V$, $101_V$, $110_U$, $109_U$, $108_U$, $107_U$, $106_U$, $105_U$, $104_U$, $103_U$, $102_U$ and $101_U$ are arranged in this order toward the direction X.

The lead 121 is connected to each operating power source end $V_{CC}$ of the switching control circuits $IC_U$, $IC_V$, $IC_W$ and drawn to the outgoing direction described above at both ends of the resin package PKG in the direction X.

The lead 123 is drawn to the outgoing direction from a position between those from which the leads 121 and $101_V$ are drawn. The lead 123 is connected to the metal plate $K_{UP}$ by the aluminum interconnect line 130 crossing over the lead 121. The metal plate $K_{UP}$ is interconnected to the metal plates $K_{VP}$ and $K_{WP}$ by the aluminum interconnect line 150.

The leads $101_R$, $102_R$, $108_R$ and $109_R$ are respectively connected, each crossing over the lead 121, to the emitter of the transistor $Q_{RP}$, the gate of the transistor $Q_{RP}$, the emitter of the transistor $Q_{RN}$ and the gate of the transistor $Q_{RN}$, by the respective aluminum interconnect lines $131_R$, $132_R$, $133_R$ and $134_R$ each crossing over the lead 121.

The anode of the free-wheeling diode $D_{RP}$ is connected to the emitter of the transistor $Q_{RP}$ and the metal plate $K_{RN}$ by the aluminum interconnect lines $141_R$ and $143_R$, respectively. The anode of the free-wheeling diode $D_{RN}$ is connected to the emitter of the transistor $Q_{RN}$ by the aluminum interconnect line $142_R$.

The lead 123 serves as the high-potential side inverter power source terminal P. The lead $108_R$ serves as the low-potential side inverter power source terminal $N_R$. Further, the lead $101_R$, the lead $103_R$ and the lead $104_R$ serve as the load side output terminal $V_{RFS}$, the bootstrap input terminal $V_{RFB}$ and the high-potential side control input terminal $R_P$, respectively. Still further, both the leads $105_U$, $106_U$ serve as the ground terminal $V_{CU}$, the leads $105_V$, $106_V$ as the ground terminal $V_{CV}$ and the leads $105_W$, 122 as the ground terminal $V_{CW}$. Additionally, the lead $107_R$, the lead $110_R$, the lead $106_W$ and the lead 121 respectively serve as the low-potential side control input terminal $R_N$, the short-circuit detecting terminal $CI_R$, the error detecting terminal F and the operating power source terminal $V_{N1}$.

In the first preferred embodiment, the leads $101_R$ through $110_R$ and the leads 121 through 123 are arranged in the resin package PKG along the direction X at a predetermined terminal pitch e. More particularly, the inverter module 1 is completed following the steps as follows. First, the leads $101_R$ through $110_R$, 121 through 123 and the metal plate $K_{RT}$ are integrally provided beforehand as a lead frame (not shown). Next, the switching control circuit $IC_R$, the transistor $Q_{RT}$ and the free-wheeling diode $D_{RT}$ are mounted on the lead frame and interconnected as described above by the aluminum interconnect lines 130, $131_R$ through $134_R$, $141_R$ through $143_R$, 150 and the gold interconnect lines. Thereafter the resin package PKG is formed by resin sealing. The leads $101_R$ through $110_R$, 121 through 123 and the metal plate $K_{RT}$ protruding from the resin package PKG are cut to predetermined lengths.

The leads $101_R$ through $110_R$ and 121 through 123 are arranged according to arrangement of pins of so-called zigzag in-line package (ZIP). That is, alternate ones of the leads $101_R$ through $110_R$ and 121 through 123 are bent toward the two defined directions. These two directions include a direction Y orthogonal to the direction X (the direction toward the viewer) and a direction Z opposite to the direction Y (the direction away from the viewer).

The part of the lead frame to serve as the metal plate $K_{RT}$ and having a protrusion from the resin package PKG is cut in the vicinity of the resin package PKG. Therefore, the length of the portion of the metal plate $K_{RT}$ exposed from the resin package PKG is short.

Similar to the metal plate $K_{RT}$, some leads are cut in the vicinity of the resin package PKG. The high-potential side control end HO and the low-potential side control end LO of the switching control circuit $IC_R$ should be operative inside the inverter module 1 (see FIG. 1). As illustrated in FIG. 2, further, they are not required to be taken out of the inverter module 1. For this reason, the leads $102_R$ and $109_R$ having respective connections to the ends HO and LO are cut in the vicinity of the resin package PKG. One end of the lead 121 serving as the operating power source terminal $V_{N1}$ is not required to be drawn to the outside. In the first preferred embodiment, the part of the lead 121 arranged adjacent to the lead 123 is cut in the vicinity of the resin package PKG. The ground ends GND and COM are both connected to the lead $105_R$ in the inverter module 1. Therefore, the lead $105_R$ is also cut in the vicinity of the resin package PKG. In contrast, the leads $106_U$, $106_V$ and 122 are drawn elongated.

Figure 8:
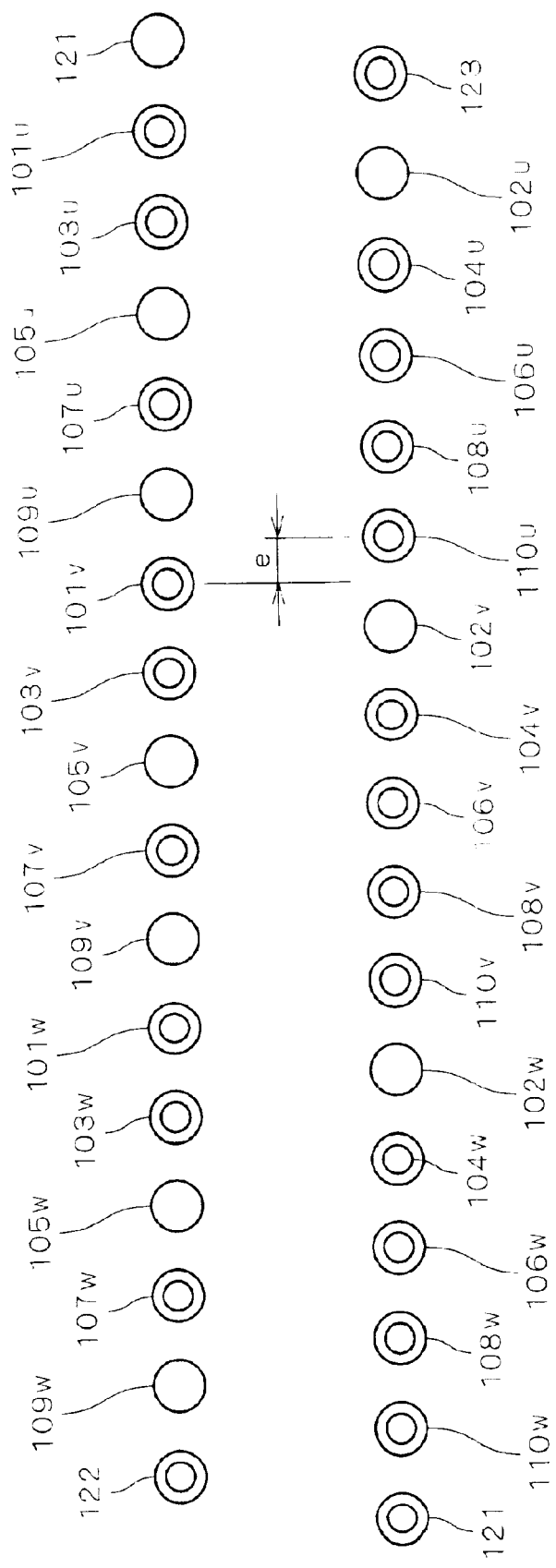
FIG. 8 is a side view illustrating arrangement of pins of the inverter module according to the first preferred embodiment of the present invention.

FIG. 8 is a side view illustrating arrangement of pins viewed from a direction 8 defined in FIG. 6. The leads drawn and elongated from the resin package PKG to serve as the respective terminals are designated by double circles. The leads respectively cut in the vicinity of the resin package PKG are designated by single circles.

Figure 9:
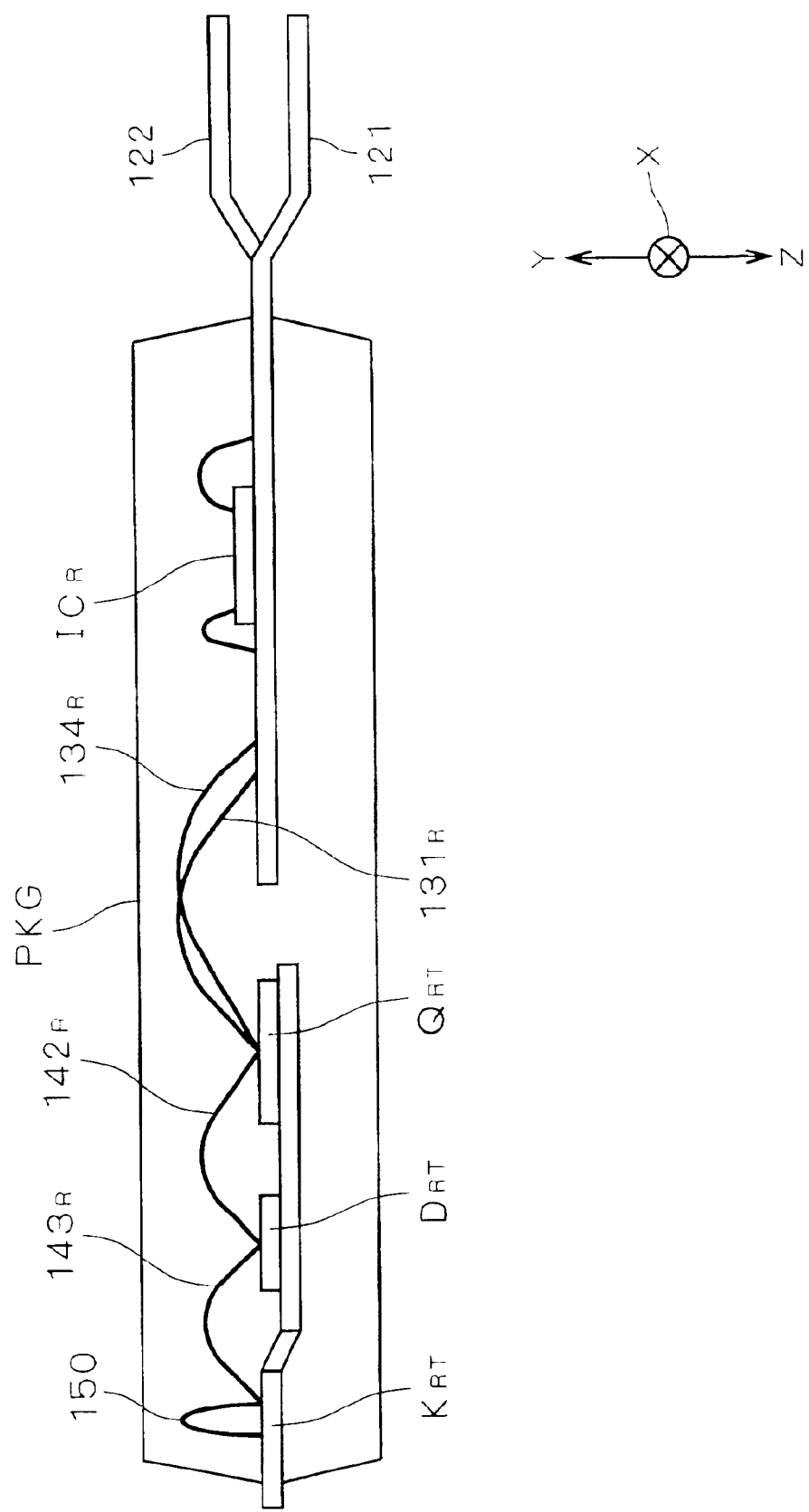
FIG. 9 is a perspective view illustrating the inverter module according to the first preferred embodiment of the present invention.

FIG. 9 is a perspective view illustrating the inverter module 1 viewed toward the direction X. The metal plate $K_{RT}$ includes a portion for holding the free-wheeling diode $D_{RT}$ and the transistor $Q_{RT}$ mounted thereon, and a portion defined near the edge of the resin package PKG and extending toward the direction Y.

As described above, high potential of several hundreds of volts may be applied to the bootstrap input end $V_B$, the load side output end $V_S$ and the high-potential side control end HO of the switching control circuit $IC_R$ arranged in the high-potential island that is surrounded by the guard ring G. In order to increase creepage distance between these terminals and other terminals receiving no high potential, the first preferred embodiment is characteristically described as follows.

First, the lead $101_R$ in each phase serving as the load side output terminal $V_{RFS}$ is bent to extend toward the direction Y. Both the lead $104_R$ serving as the high-potential side control input terminal $R_P$ and the lead $107_R$ as the low-potential side control input terminal $R_N$ satisfy at least either one of the following first and second conditions. The first condition requires bending and extending toward the direction Z. The second condition requires distance of three times the terminal pitch (3e) or more from the lead $101_R$ serving as the load side output terminal $V_{RFS}$.

When the first condition is satisfied, on the substrate having connection to the ends of a plurality of terminals, the creepage distance is increased between the positions receiving high voltage applied thereto. When the second condition is satisfied, at the bottoms of the plurality of terminals on the side of the semiconductor device, the creepage distance is increased as well between these positions.

More particularly, the lead $104_R$ is bent to extend toward the direction Z, thereby satisfying the first condition. In addition, each lead $107_R$ is arranged at a distance 4e or more from every lead $101_R$, thereby satisfying the second condition. The lead $109_U$ is interposed between the leads $107_U$ and $101_V$. Further, the lead $109_V$ is interposed between the leads $107_V$ and $101_W$. The arrangement of terminals satisfying the second condition is thereby accomplished.

The lead $102_R$ is connected to the high-potential side control end HO and therefore receives high voltage applied thereto. However, the tips of the lead $102_R$ is cut to a short length. It is therefore possible to secure creepage distance on the substrate for holding the inverter module 1 mounted thereon.

The lead $103_R$ serving as the bootstrap input terminal $V_{RFB}$ is bent to extend toward the direction Y or toward the direction Z. Both the lead $104_R$ serving as the high-potential side control input terminal $R_P$ and the lead $107_R$ as the low-potential side control input terminal $R_N$ satisfy at least either one of the following third and fourth conditions. The third condition requires bending and extending toward the direction Z or toward the direction Y opposite to the bending direction of the lead $103_R$. The fourth condition requires distance of three times the terminal pitch (3e) or more from the lead $103_R$ serving as the bootstrap input terminal $V_{RFB}$.

When the third condition is satisfied, on the substrate having connection to the ends of a plurality of terminals, the creepage distance is increased between the positions receiving high voltage applied thereto. When the fourth condition is satisfied, at the bottoms of the plurality of terminals on the side of the semiconductor device, the creepage distance is increased as well between these positions. In addition, downsizing of the inverter module is facilitated.

More particularly, the lead $103_R$ is bent to extend toward the direction Y while the lead $104_R$ is bent to extend toward the direction Z, thereby satisfying the third condition. In addition, each lead $107_R$ is arranged at a distance 4e or more from every lead $103_R$, thereby satisfying the fourth condition. The lead $105_R$ having a tip cut to a short length is interposed between the leads $103_R$ and $107_R$. The arrangement of terminals satisfying the fourth direction is thereby accomplished.

Further, the lead $101_R$ is bent to extend toward the direction Y in each phase. As a result, on the substrate for holding the inverter module 1 mounted thereon, interconnection between the lead $101_R$ in each phase and the load 3 is facilitated.

Still further, the leads 123 and $108_R$ are all bent to extend toward the direction Z. As a result, on the substrate for holding the inverter module 1 mounted thereon, interconnection between these leads and the DC power source E1 is facilitated.

Second Preferred Embodiment

Figure 10:
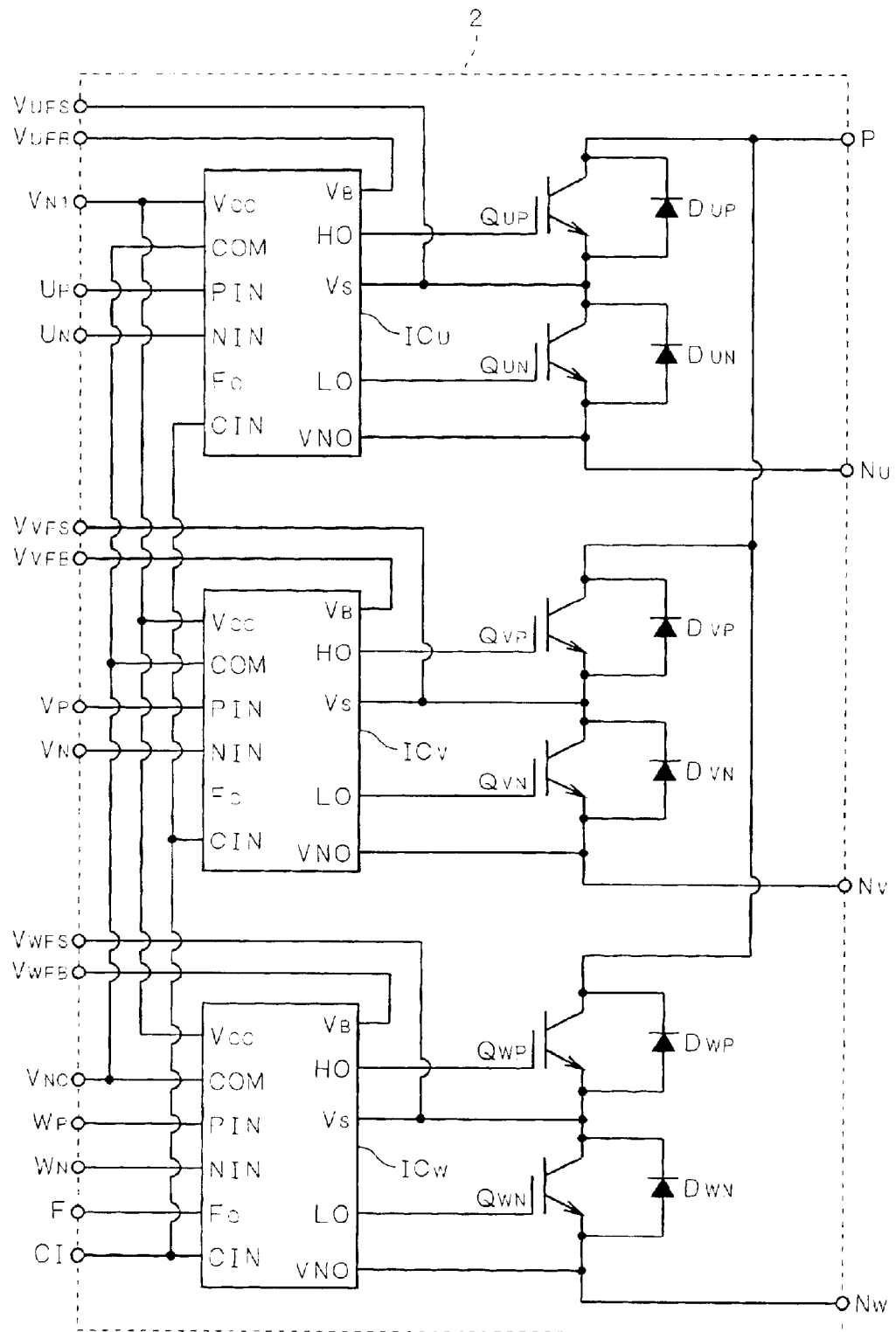
FIG. 10 is a circuit diagram illustrating the internal structure of an inverter module as a semiconductor device according to a second preferred embodiment of the present invention.

FIG. 10 is a circuit diagram illustrating the internal structure of an inverter module 2 as a semiconductor device according to the second preferred embodiment of the present invention. Similar to the inverter module 1, the inverter module 2 includes the switching control circuit $IC_R$, the transistor $Q_{RT}$ and the free-wheeling diode $D_{RT}$. These elements are interconnected in the same way as the inverter module 1.

In contrast to the first preferred embodiment, however, the short-circuit detecting terminals $CI_U$, $CI_V$ and $CI_W$ provided in the inverter module 1 are combined into one short-circuit detecting terminal CI. Namely, the short-circuit detecting ends CIN of each switching control circuit $IC_R$ are mutually connected to one another in the inverter module 2 and connected further to the short-circuit detecting terminal CI.

The ground terminals $V_{CU}$, $V_{CV}$ and $V_{CW}$ provided in the inverter module 1 are combined into one ground terminal $V_{NC}$. Namely, the ground ends COM of each switching control circuit $IC_R$ are mutually connected to one another in the inverter module 2 and connected further to the ground terminal $V_{NC}$.

Figure 11:
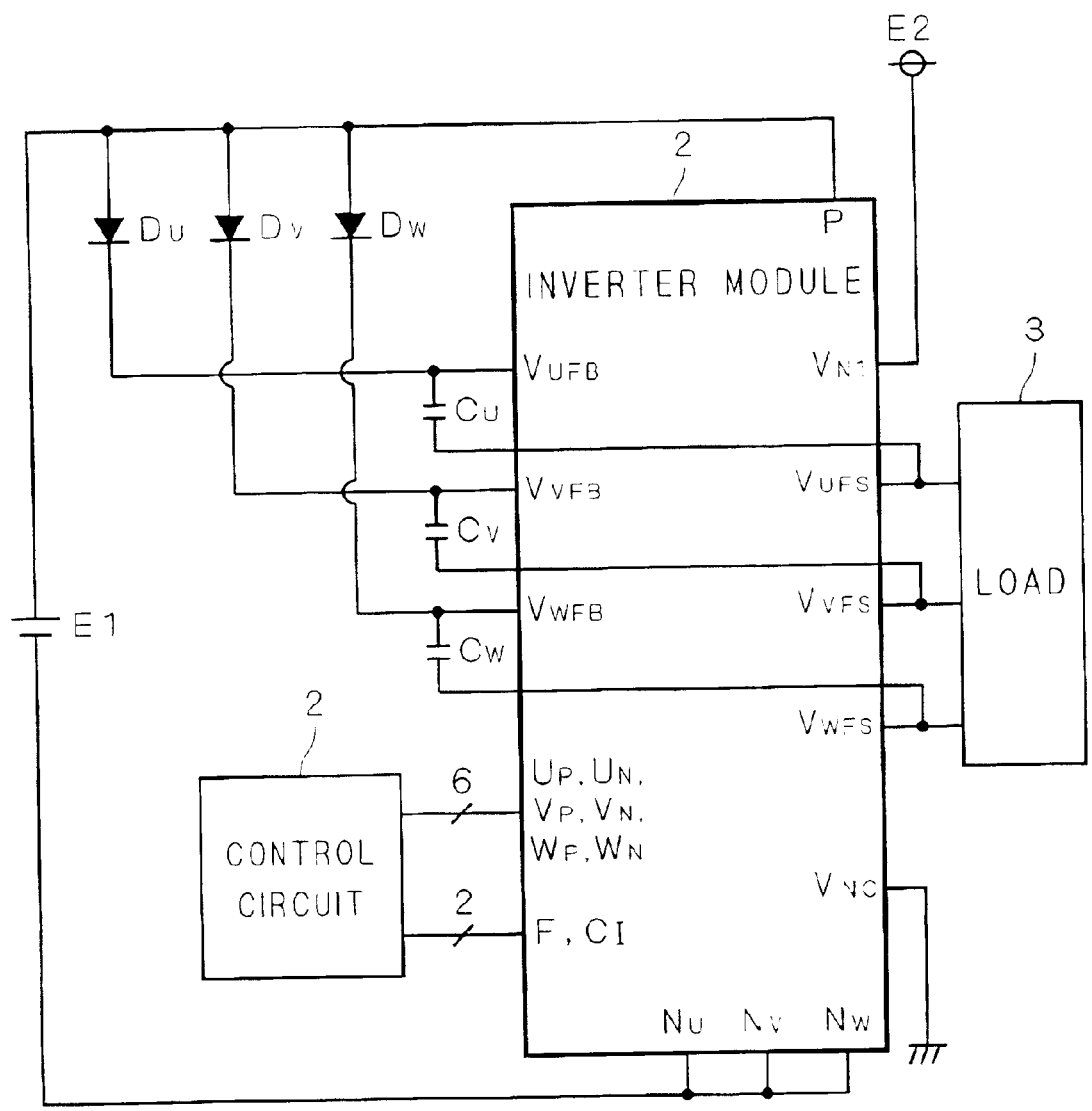
FIG. 11 is a circuit diagram illustrating a driving circuit for driving a load in the second preferred embodiment of the present invention.

FIG. 11 is a circuit diagram illustrating a driving circuit for driving the three-phase inductive load 3 using the inverter module 2. The structure of the driving circuit in FIG. 11 differs from that of the driving circuit illustrated in FIG. 2 in that the short-circuit detecting terminals $CI_U$, $CI_V$, $CI_W$ are combined into one short-circuit detecting terminal CI and the ground terminals $V_{CU}$, $V_{CV}$, $V_{CW}$ are combined into one ground terminal $V_{NC}$.

Figure 13:
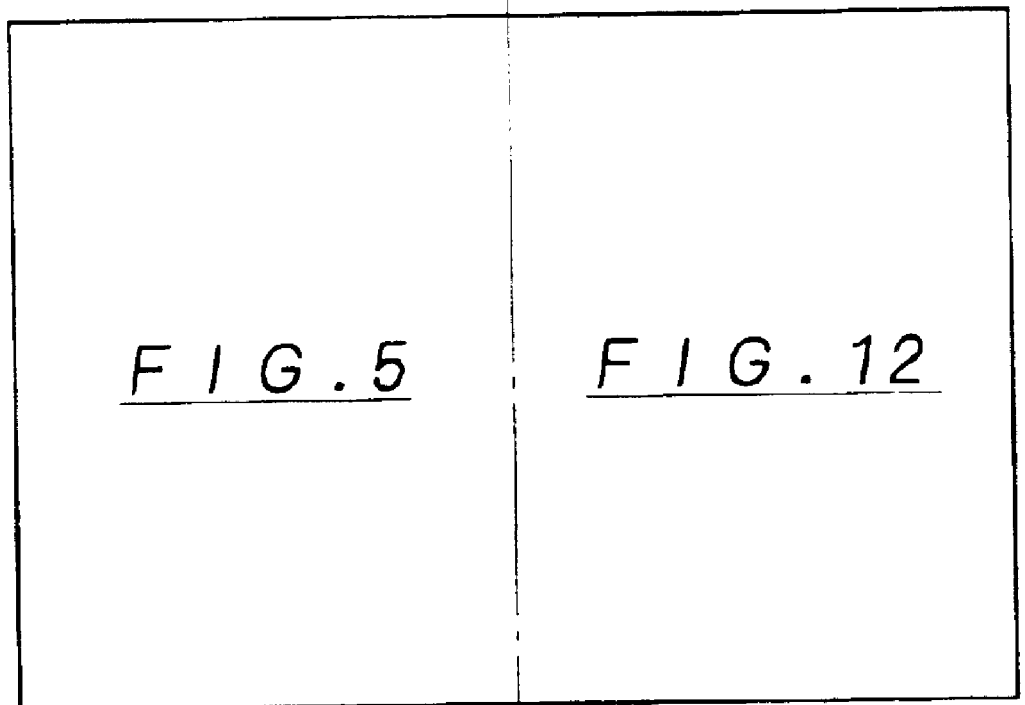
FIG. 13 is a view illustrating how
Figure 14:
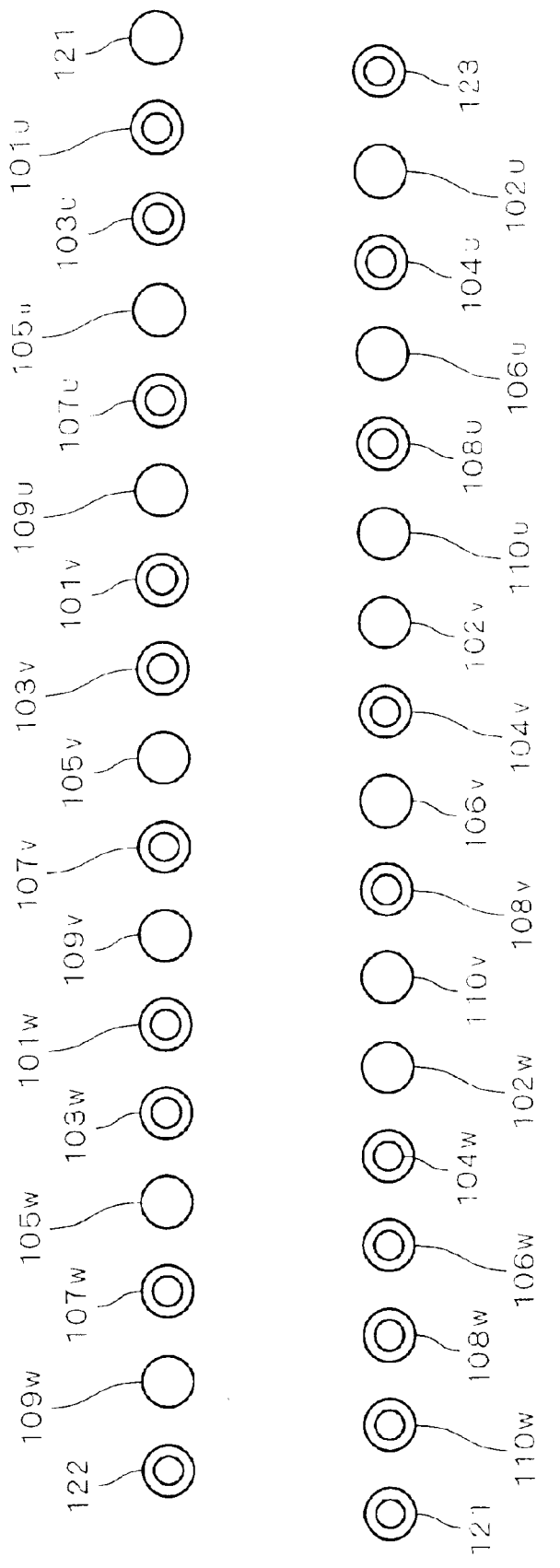
FIG. 14 is a side view illustrating arrangement of pins of the inverter module according to the second preferred embodiment of the present invention.

FIG. 12 is a plan view partially illustrating the internal structure of the inverter module 2 as the semiconductor device according to the second preferred embodiment of the present invention. In the second preferred embodiment, FIGS. 5 and 12 are combined by the phantom line J1J1. That is, FIGS. 5 and 12 are views illustrating in combination the internal structure of the inverter module 2. FIG. 13 is a view illustrating how FIGS. 5 and 12 are combined. FIG. 14 is a side view illustrating arrangement of pins viewed from the direction 14 defined in FIG. 12. The leads drawn and elongated from the resin package PKG to serve as the respective terminals are designated by double circles. The leads respectively cut in the vicinity of the resin package PKG are designated by single circles.

In the second preferred embodiment, among those having respective tips that are drawn in the first preferred embodiment, the lead $106_U$ integrally formed with the lead $105_U$, the lead $106_V$ integrally formed with the lead $105_V$ and the leads $110_U$, $110_V$ both serving as the short-circuit detecting terminal CI are cut in the vicinity of the resin package PKG.

Further characteristically, in the second preferred embodiment, the leads $105_U$, $105_V$, $106_U$, $106_V$ and $105_W$ are integrally formed with the lead 122. The lead 122 therefore serves as the ground terminal $V_{NC}$. Still characteristically, the leads $110_U$ and $110_V$ are interconnected to the lead $110_W$ by an aluminum interconnect line 151. The lead $110_W$ therefore serves as the short-circuit detecting terminal CI.

As described, in the inverter module 2, the ground ends COM of each switching control circuit $IC_R$ are mutually connected and the short-circuit detecting ends CIN of the same are also mutually connected. As a result, the number of leads to be drawn to the outside can be reduced. More particularly, 20 leads are drawn in the second preferred embodiment while the first preferred embodiment requires 24 leads to be drawn.

Third Preferred Embodiment

Figure 15:
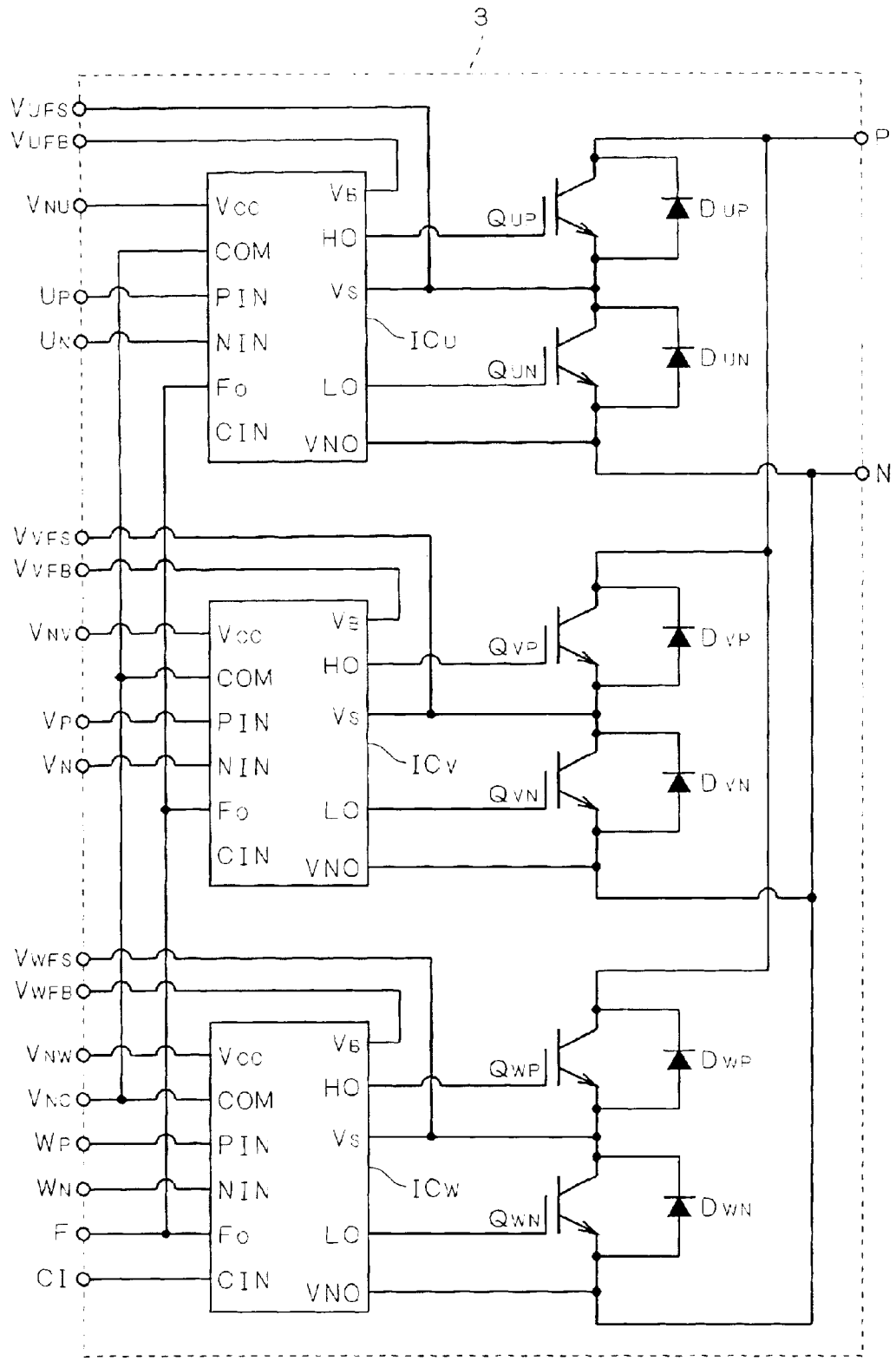
FIG. 15 is a circuit diagram illustrating the internal structure of an inverter module according to a third preferred embodiment of the present invention.

FIG. 15 is a circuit diagram illustrating the internal structure of an inverter module 3 as a semiconductor device according to the third preferred embodiment of the present invention. Similar to the inverter module 1, the inverter module 3 includes the switching control circuit $IC_R$, the transistor $Q_{RT}$ and the free-wheeling diode $D_{RT}$. These elements are interconnected to one another in the same way as the inverter module 1.

In contrast to the first preferred embodiment, however, the inverter module 3 does not include the short-circuit detecting terminals $CI_U$, $CI_V$ and $CI_W$ that are provided in the inverter module 1. Instead, the short-circuit detecting terminal CI having connection to the short-circuit detecting end CIN of the switching control circuit $IC_W$ is provided. The inverter module 3 does not include the operating power source terminal $V_{N1}$ either that has connection to the respective operating power source ends $V_{CC}$ of the switching control circuits $IC_U$, $IC_V$ and $IC_W$ in the first preferred embodiment. Instead, operating power source terminals $V_{NU}$, $V_{NV}$ and $V_{NW}$ respectively connected to the operating power source ends $V_{CC}$ of the switching control circuits $IC_U$, $IC_V$ and $IC_W$ are provided. Further, the respective error detecting ends $F_O$ of the switching control terminals $IC_U$ and $IC_V$ as well as the error detecting end $F_O$ of the switching control circuit $IC_W$ are commonly connected to the error detecting terminal F. The ground terminals $V_{CU}$, $V_{CV}$ and $V_{CW}$ provided in the inverter module 1 are combined into one ground terminal $V_{NC}$. Namely, the respective ground ends COM of the switching control circuit $IC_U$, $IC_V$ and $IC_W$ are mutually connected to one another in the inverter module 3 and connected further to the ground terminal $V_{NC}$.

In addition, the low-potential side inverter power source terminal $N_U$, $N_V$ and $N_W$ are combined into one ground terminal N. Namely, the respective inverter side ground ends VNO of the switching control circuits $IC_U$, $IC_V$, $IC_W$ and the respective emitters of the transistors $Q_{UN}$, $Q_{VN}$ and $Q_{WN}$ are commonly connected to the ground terminal N.

Figure 16:
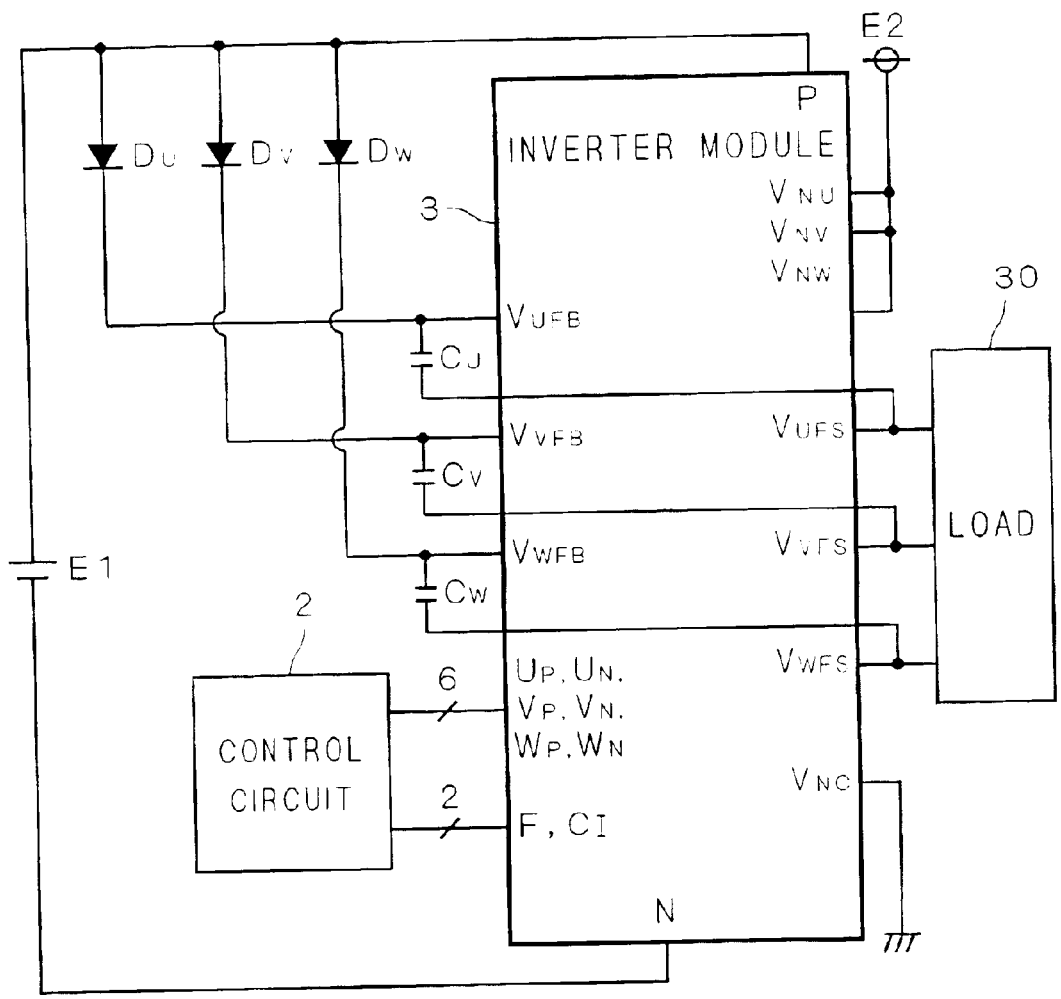
FIG. 16 is a circuit diagram illustrating a driving circuit for driving a load in the third preferred embodiment of the present invention.

FIG. 16 is a circuit diagram illustrating a driving circuit for driving a three-phase load 30 using the inverter module 3. The structure of the driving circuit in FIG. 16 differs from that of the driving circuit illustrated in FIG. 2 in that the short-circuit detecting terminals $CI_U$, $CI_V$, $CI_W$ are substituted with one short-circuit detecting terminal CI, the ground terminals $V_{CU}$, $V_{CV}$, $C_{CW}$ are combined into one ground terminal $V_{NC}$, the low-potential side inverter power source terminal $N_U$, $N_V$, $N_W$ are combined into one ground terminal N and the operating power source terminal $V_{N1}$ is divided into the operating power source terminals $V_{NU}$, $V_{NV}$, $V_{NW}$.

Figure 17:
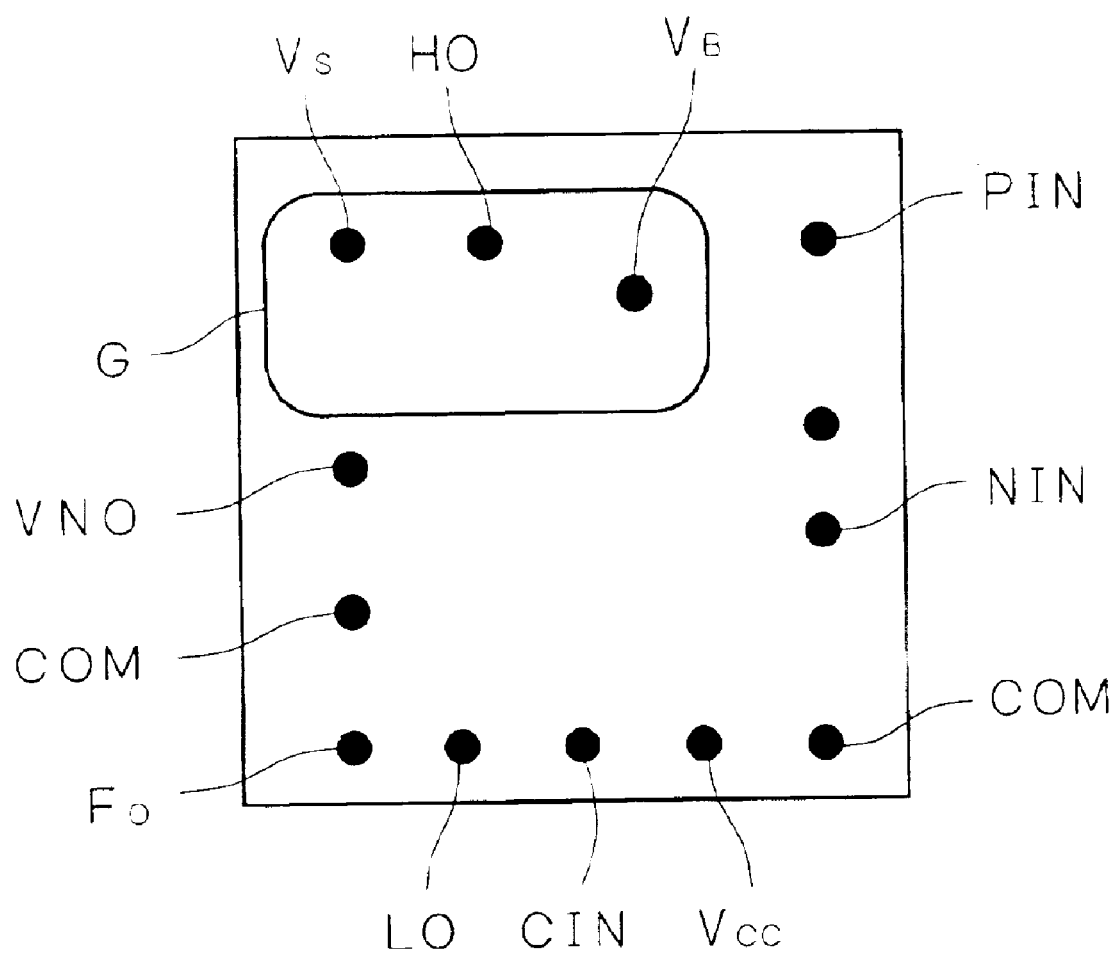
FIG. 17 is a plan view illustrating a switching control circuit according to the third preferred embodiment of the present invention.

FIG. 17 is a plan view from the same direction as FIG. 3 for illustrating placement of each pin of the switching control circuit $IC_R$ employed in the third preferred embodiment. The load side output end $V_S$, the high-potential side control end HO, the high-potential side control input end PIN, the low-potential side control input end NIN, the ground end COM, the operating power source end $V_{CC}$, the short-circuit detecting end CIN, the low-potential side control end LO, the error detecting end $F_O$, the ground end COM and the inverter side ground end VNO are arranged in this order in a clockwise direction on the periphery of the switching control circuit $IC_R$. That is, the placement according to the third preferred embodiment requires a pair of ground ends COM.

The bootstrap input end $V_B$ is arranged between the high-potential side control end HO and the high-potential side control input end PIN in a direction in which the load side output end $V_S$, the high-potential side control end HO and the high-potential side control input end PIN are aligned (namely, the direction horizontal to the plane of the drawing). Further, the bootstrap input end $V_B$ is located at a position closer to the line of the operating power source end $V_{CC}$, the short-circuit detecting end CIN and the low-potential side control end LO than the load side output end $V_S$, the high-potential side control end HO and the high-potential side control input end PIN.

Similar to the placement of the first preferred embodiment described in reference to FIG. 4, in the switching control circuit $IC_R$, the bootstrap input end $V_B$, the load side output end $V_S$ and the high-potential side control end HO are arranged in the high-potential island surrounded by the guard ring G.

Figure 18:
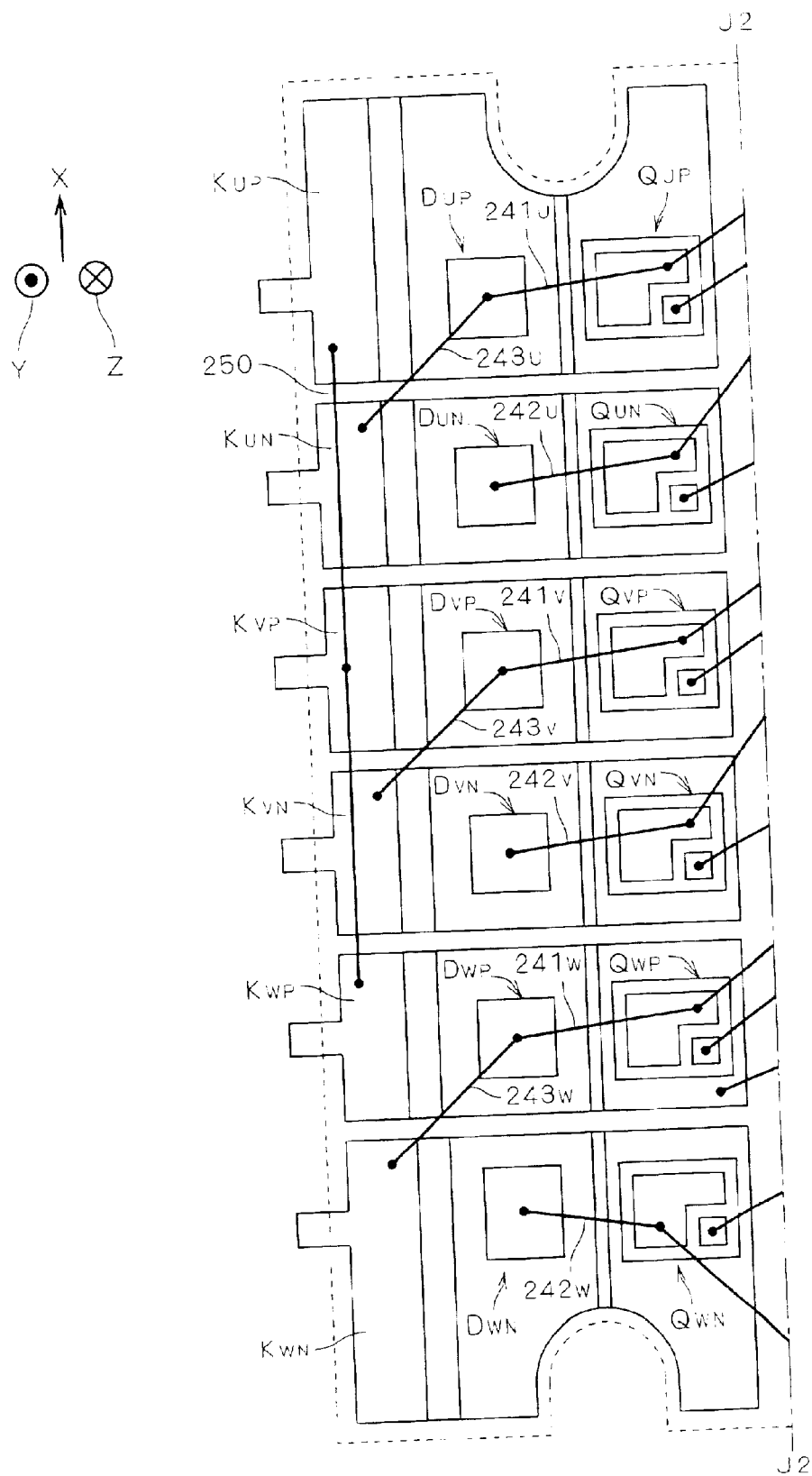
FIG. 18 is a plan view illustrating the internal structure of the inverter module according to the third preferred embodiment of the present invention in combination with FIG. 19.
Figure 19:
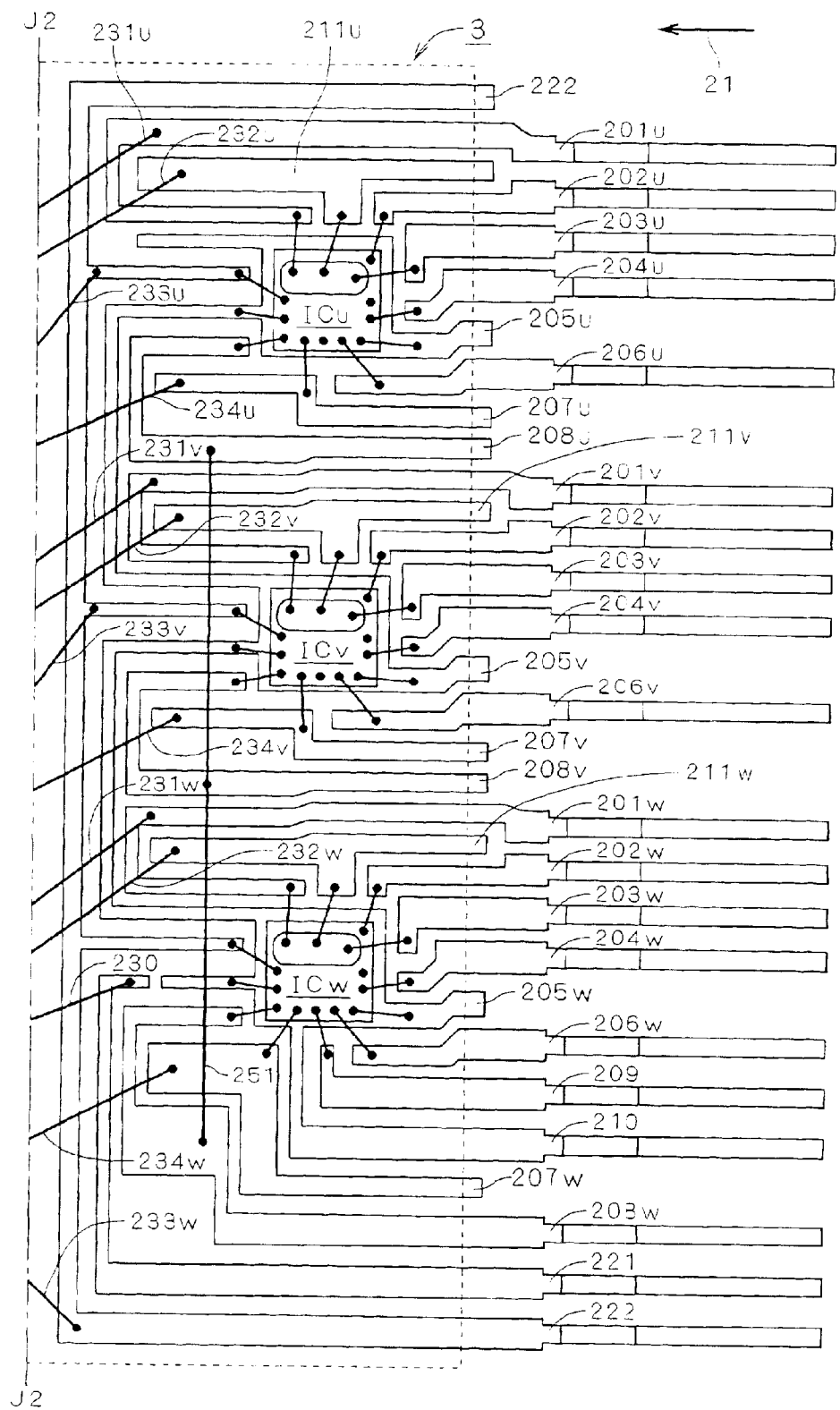
FIG. 19 is a plan view illustrating the internal structure of the inverter module according to the third preferred embodiment of the present invention in combination with FIG. 18.
Figure 20:
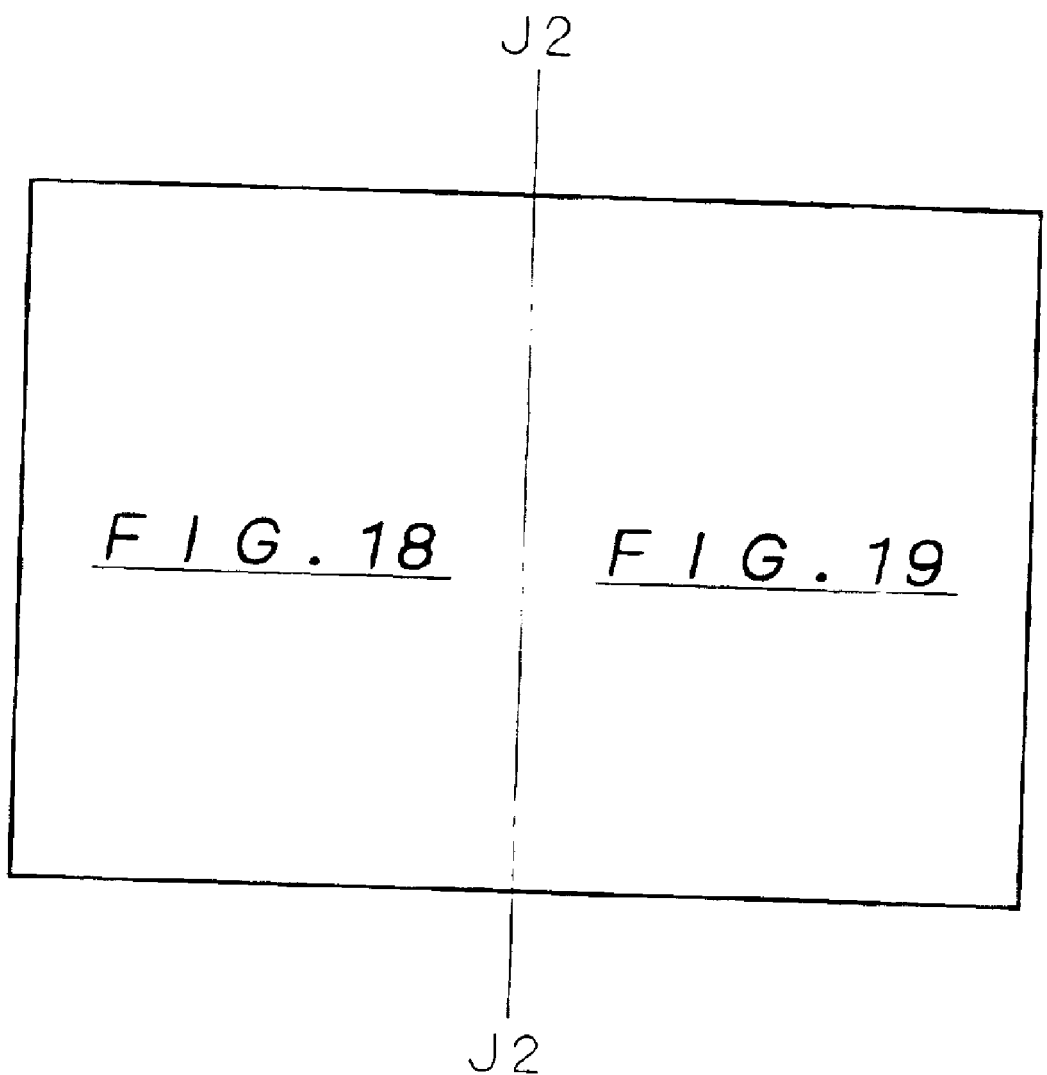
FIG. 20 is a view illustrating how

FIGS. 18 and 19 are plan views illustrating in combination the internal structure of the inverter module 3. FIG. 20 is a view illustrating how FIGS. 18 and 19 are combined. In FIG. 20, FIGS. 18 and 19 are combined by a phantom line J2J2.

The inverter module 3 includes leads $201_R$ through $208_R$, 209, 210, $211_R$, 221, 222, the metal plate $K_{RT}$, aluminum interconnect lines 230, $231_R$ through $234_R$, $241_R$ through $243_R$, 250, 251, the switching control circuit $IC_R$ and gold interconnect lines for connecting the switching control circuit $IC_R$ and these leads. The inverter module 3 is sealed with the resin package PKG. A lead frame (not shown) is cut and formed into the metal plate $K_{RT}$ and the leads $201_R$ through $208_R$, 209, 210, $211_R$, 221, 222 that are originally integral with one another.

The leads $201_R$, $202_R$, $203_R$, $204_R$, $205_R$, $206_R$, $207_R$, $208_R$ and $211_R$ are respectively connected to the load side output end $V_S$, the high-potential side control input end PIN, the bootstrap input end $V_B$, the low-potential side control input end NIN, the pair of ground ends COM, the operating power source end $V_{CC}$, the low-potential side control end LO, the error detecting end $F_O$ and the high-potential side control end HO of the switching control circuit $IC_R$ by the gold interconnect lines. Further, the lead 209 is connected to the short-circuit detecting end CIN of the switching control circuit $IC_W$ by the gold interconnect line.

The leads $205_U$, $205_V$ and $205_W$ respectively hold the switching control circuits $IC_U$, $IC_V$ and $IC_W$ mounted thereon. Each of these leads is integrally formed with the lead 210.

The switching control circuits $IC_W$, $IC_V$ and $IC_U$ are arranged in this order toward the first direction X. The switching control terminal $IC_R$ is so arranged that the terminals thereof are located at the respective positions illustrated in FIG. 17. Further, the leads $201_R$ through $208_R$, 209, 210 and $211_R$ are all drawn to the outgoing direction orthogonal to the direction X that is indicated as a direction to the right in FIG. 19. The tips of these leads in the outgoing direction are arranged in the following order toward the direction X. That is, the tips of the leads $208_W$, $207_W$, 210, 209, $206_W$, $205_W$, $204_W$, $203_W$, $202_W$, $211_W$, $201_W$, $208_V$, $207_V$, $206_V$, $205_V$, $204_V$, $203_V$, $202_V$, $211_V$, $201_V$, $208_U$, $207_U$, $206_U$, $205_U$, $204_U$, $203_U$, $202_U$, $211_U$ and $201_U$ are arranged in this order toward the direction X.

The lead 222 is connected to each inverter side ground end VNO of the switching control circuits $IC_U$, $IC_V$, $IC_W$ and drawn to the outgoing direction described above at both ends of the resin package PKG in the direction X.

The lead 221 is drawn to the outgoing direction from a position between those from which the leads 222 and $208_W$ are drawn. The lead 221 is connected to the metal plate $K_{WP}$ by the aluminum interconnect line 230 crossing over the lead 222. The metal plate $K_{WP}$ is interconnected to the metal plates $K_{VP}$ and $K_{UP}$ by the aluminum interconnect line 250.

The leads $201_R$, $211_R$ and $207_R$ are respectively connected, each crossing over the lead 222, to the emitter of the transistor $Q_{RP}$, the gate of the transistor $Q_{RP}$ and the gate of the transistor $Q_{RN}$ by the respective aluminum interconnect lines $231_R$, $232_R$ and $234_R$. The lead 222 is connected to the emitters of each transistor $Q_{RN}$ by the aluminum interconnect lines $233_U$, $233_V$ and $233_W$.

The anode of the free-wheeling diode $D_{RP}$ is connected to the emitter of the transistor $Q_{RP}$ and the metal plate $K_{RN}$ by the aluminum interconnect lines $241_R$ and $243_R$, respectively. The anode of the free-wheeling diode $D_{RN}$ is connected to the emitter of the transistor $Q_{RN}$ by the aluminum interconnect line $242_R$.

The lead 221 serves as the high-potential side inverter power source terminal P. The lead 222 serves as the ground terminal N. Further, the lead $201_R$, the lead $202_R$, the lead $203_R$, the lead $204_R$, the lead $206_R$, the lead $208_W$, the lead 209 and the lead 210 respectively serve as the load side output terminal $V_{RFS}$, the high-potential side control input terminal $R_P$, the bootstrap input terminal $V_{RFB}$, the low-potential side control input terminal $R_N$, the operating power source terminal $V_{NR}$, the error detecting terminal F, the short-circuit detecting terminal CI and the ground terminal $V_{NC}$.

In the third preferred embodiment, the leads $201_R$ through $208_R$, 209, 210, 221 and 222 are arranged in the resin package PKG along the direction X at the predetermined terminal pitch e. Further, the lead $211_R$ is arranged between the leads $201_R$ and $202_R$ at a distance of approximately e/2 from the leads $201_R$ and $202_R$.

More particularly, the inverter module 3 is completed following the steps as follows. First, the leads $201_R$ through $208_R$, 209, 210, $211_R$, 221, 222 and the metal plate $K_{RT}$ are integrally provided beforehand as a lead frame (not shown). Next, the switching control circuit $IC_R$, the transistor $Q_{RT}$ and the free-wheeling diode $D_{RT}$ are mounted on the lead frame and interconnected as described above by the gold interconnect lines and the aluminum interconnect lines 230, $231_R$ through $234_R$, $241_R$ through $243_R$, 250 and 251. Thereafter the resin package PKG is formed by resin sealing. The leads $201_R$ through $208_R$, 209, 210, $211_R$, 221, 222 and the metal plate $K_{RT}$ protruding from the resin package PKG are cut to predetermined lengths.

Similar to the first preferred embodiment, the part of the lead frame to serve as the metal plate $K_{RT}$ is cut in the vicinity of the resin package PKG. Further, the leads $201_R$ through $208_R$, 209, 210, 221 and 222 are arranged according to arrangement of pins of the ZIP. That is, alternate ones of the leads $201_R$ through $208_R$, 209, 210, 221 and 222 are bent toward the two defined directions. These two directions include the direction Y orthogonal to the direction X (the direction toward the viewer) and the direction Z opposite to the direction Y (the direction away from the viewer).

Similar to the metal plate $K_{RT}$, some leads are cut in the vicinity of the resin package PKG. The high-potential side control end HO and the low-potential side control end LO of the switching control circuit $IC_R$ should be operative inside the inverter module 3 (see FIG. 15). As illustrated in FIG. 16, further, they are not required to be taken out of the inverter module 3. For this reason, the leads $211_R$ and $207_R$ having respective connections to the ends HO and LO are cut in the vicinity of the resin package PKG. One end of the lead 222 serving as the ground terminal N is not required to be drawn to the outside. In the third preferred embodiment, the part of the lead 222 arranged adjacent to the lead $201_U$ is cut in the vicinity of the resin package PKG.

The respective ground ends COM of the switching control circuits $IC_U$, $IC_V$ and $IC_W$ are mutually connected to one another in the inverter module 3 and the lead 210 is drawn from the resin package PKG. Therefore, the lead $205_R$ is also cut in the vicinity of the resin package PKG. Further, the respective error detecting ends $F_O$ of the switching control circuits $IC_U$, $IC_V$ and $IC_W$ are mutually connected to one another in the inverter module 3 and the lead $208_W$ is drawn from the resin package PKG. Therefore, the leads $208_U$ and $208_V$ are also cut in the resin package PKG.

Figure 21:
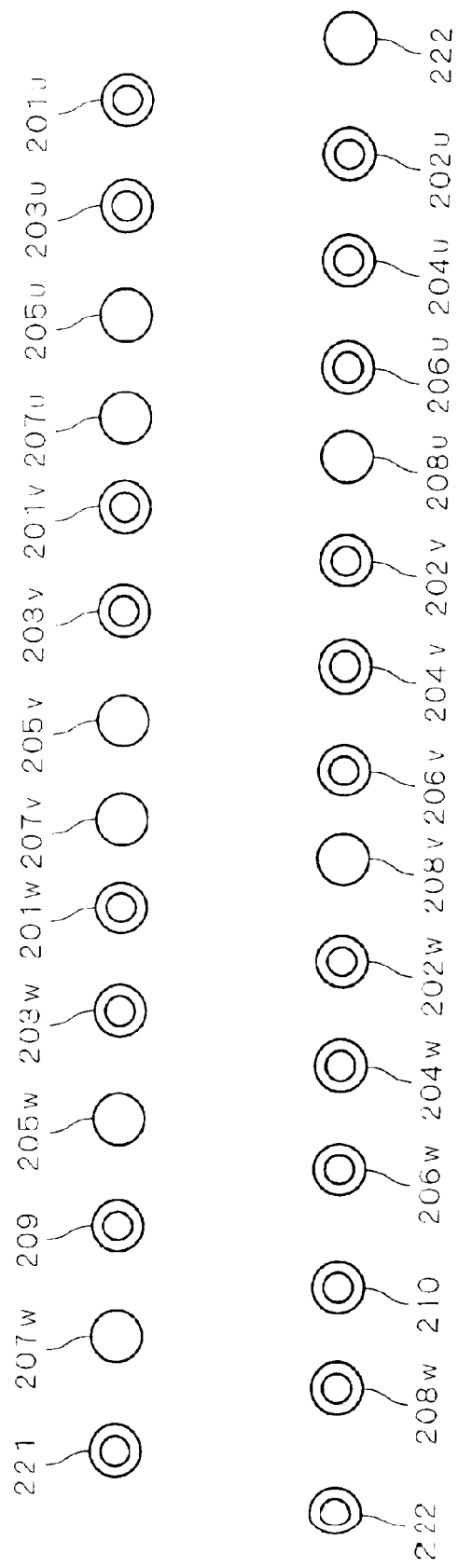
FIG. 21 is a side view illustrating arrangement of pins of the inverter module according to the third preferred embodiment of the present invention.

FIG. 21 is a side view illustrating arrangement of pins viewed from a direction 21 defined in FIG. 19. The leads drawn and elongated from the resin package PKG to serve as the respective terminals are designated by double circles. The leads cut in the vicinity of the resin package are designated by single circles.

Figure 22:
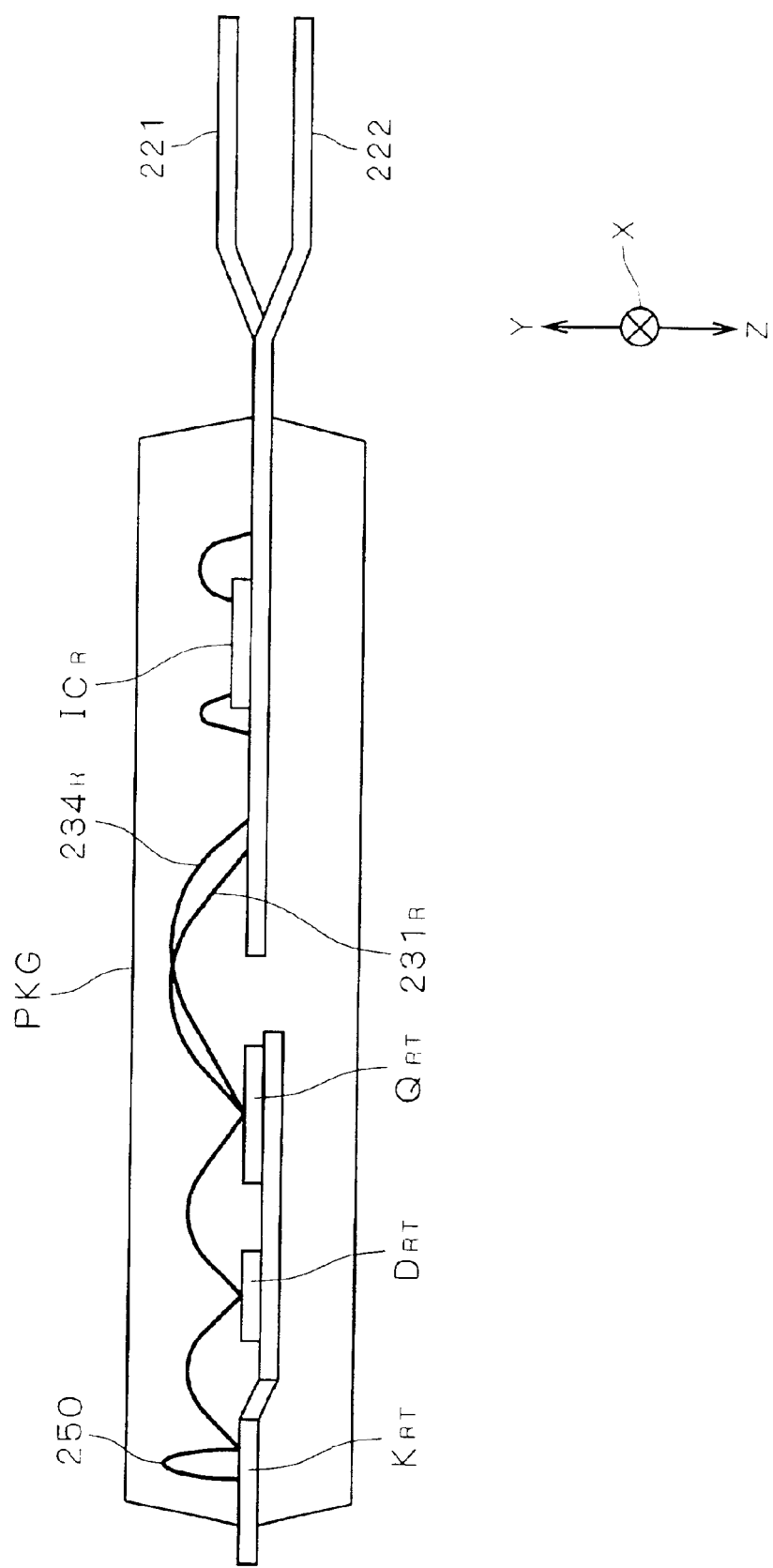
FIG. 22 is a perspective view illustrating the inverter module according to the third preferred embodiment of the present invention.

FIG. 22 is a perspective view illustrating the inverter module 3 viewed toward the direction X. Similar to the first preferred embodiment, the metal plate $K_{RT}$ includes a portion for holding the free-wheeling diode $D_{RT}$ and the transistor $Q_{RT}$ mounted thereon, and a portion defined near the edge of the resin package PKG and extending toward the direction Y.

As described above, high potential of several hundreds of volts may be applied to the bootstrap input end $V_B$, the load side output end $V_S$ and the high-potential side control end HO of the switching control circuit $IC_R$ arranged in the high-potential island that is surrounded by the guard ring G. In order to increase creepage distance between these terminals and other terminals receiving no high potential, the third preferred embodiment is characteristically described as follows.

First, the lead $201_R$ in each phase serving as the load side output terminal $V_{RFS}$ is bent to extend toward the direction Y. Both the lead $202_R$ serving as the high-potential side control input terminal $R_P$ and the lead $204_R$ as the low-potential side control input terminal $R_N$ satisfy the condition that they are bent to extend toward the direction Z (first condition). As a result, on the substrate having connection to the ends of a plurality of terminals, the creepage distance is increased between the positions receiving high voltage applied thereto.

The lead $203_R$ serving as the bootstrap input terminal $V_{RFB}$ is bent to extend toward the direction Y or toward the direction Z. Both the lead $202_R$ serving as the high-potential side control input terminal $R_P$ and the lead $204_R$ as the low-potential side control input terminal $R_N$ satisfy the condition that they are bent to extend toward the direction Z or toward the direction Y opposite to the bending direction of the lead $203_R$ (third condition). As a result, on the substrate having connection to the ends of the plurality of terminals, the creepage distance is increased between the positions receiving high voltage applied thereto. In addition, downsizing of the inverter module is facilitated.

Further, the lead $201_R$ serving as the load side output terminal $V_{RFS}$ to be connected to the load 30 is bent to extend toward the direction Y in each phase. As a result, on the substrate for holding the inverter module 3 mounted thereon, interconnection between the lead $201_R$ in each phase and the load 30 is facilitated.

In contrast to the inverter modules 1 and 2 described in the first and second preferred embodiments, respectively, the respective inverter side ground ends VNO of the switching control circuits $IC_U$, $IC_V$ and $IC_W$ are commonly connected to the low-potential side inverter power source terminal N. Therefore, the leads 221 and 222 can be arranged close to each other, or more particularly, adjacent to each other. As a result, on the substrate for holding the inverter module 3 mounted thereon, the lengths of interconnect lines for establishing connections to a smoothing capacitor and a snubber capacitor constituting the DC power source E1 can be shortened. The reduction in interconnection inductance is thereby achieved and the reduction in surge voltage is suitably allowed in addition to the advantage of facilitating downsizing of the device.

Further, the lead 222 can be arranged close to the leads 209 and 210. As a result, on the substrate for holding the inverter module 3 mounted thereon, connection to a protection circuit to be provided among the low-potential side inverter power source terminal N, the short-circuit detecting terminal CI and the ground terminal $V_{NC}$ can be easily established. Therefore, peripheral interconnection is simplified. The reduction in interconnection inductance is thereby achieved and the probability of generation of noises is suitably lowered in addition to the advantage of facilitating downsizing.

Figure 23:
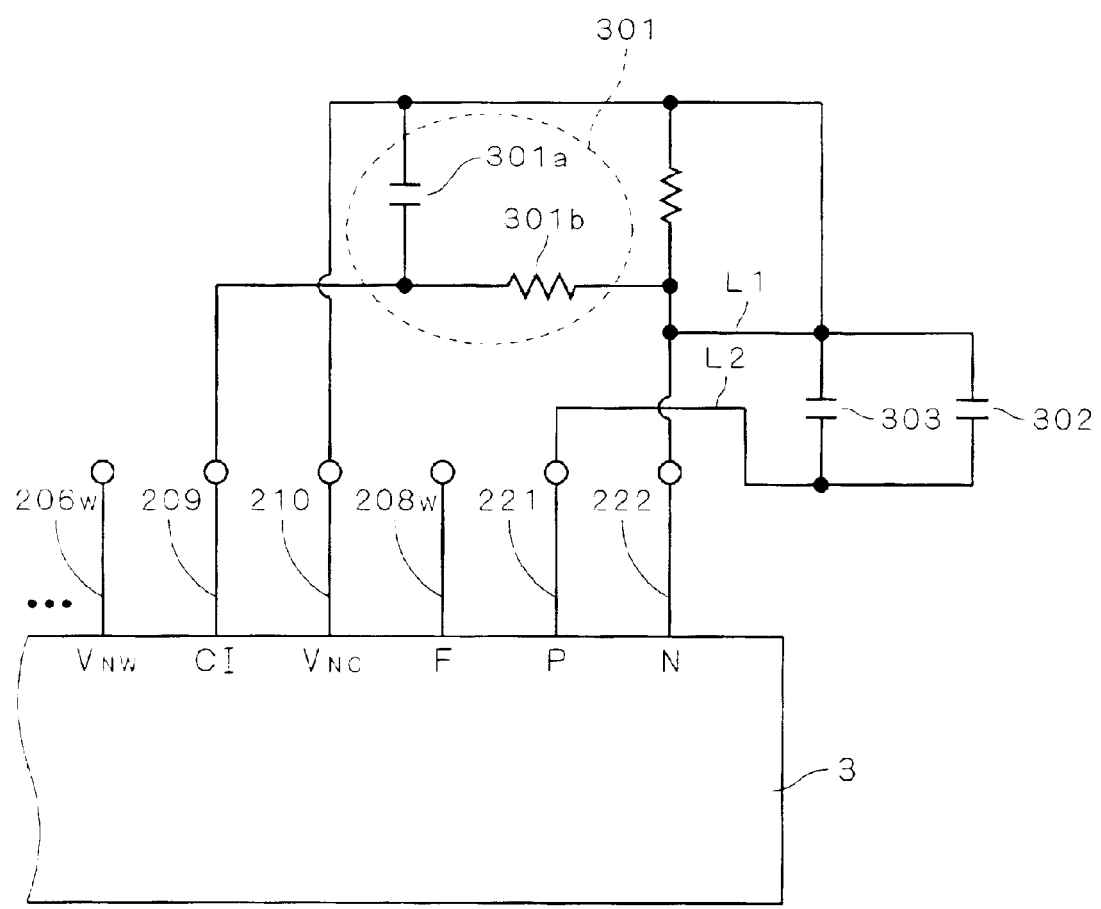
FIG. 23 is a circuit diagram describing the effects of the third preferred embodiment of the present invention.
Figure 24:
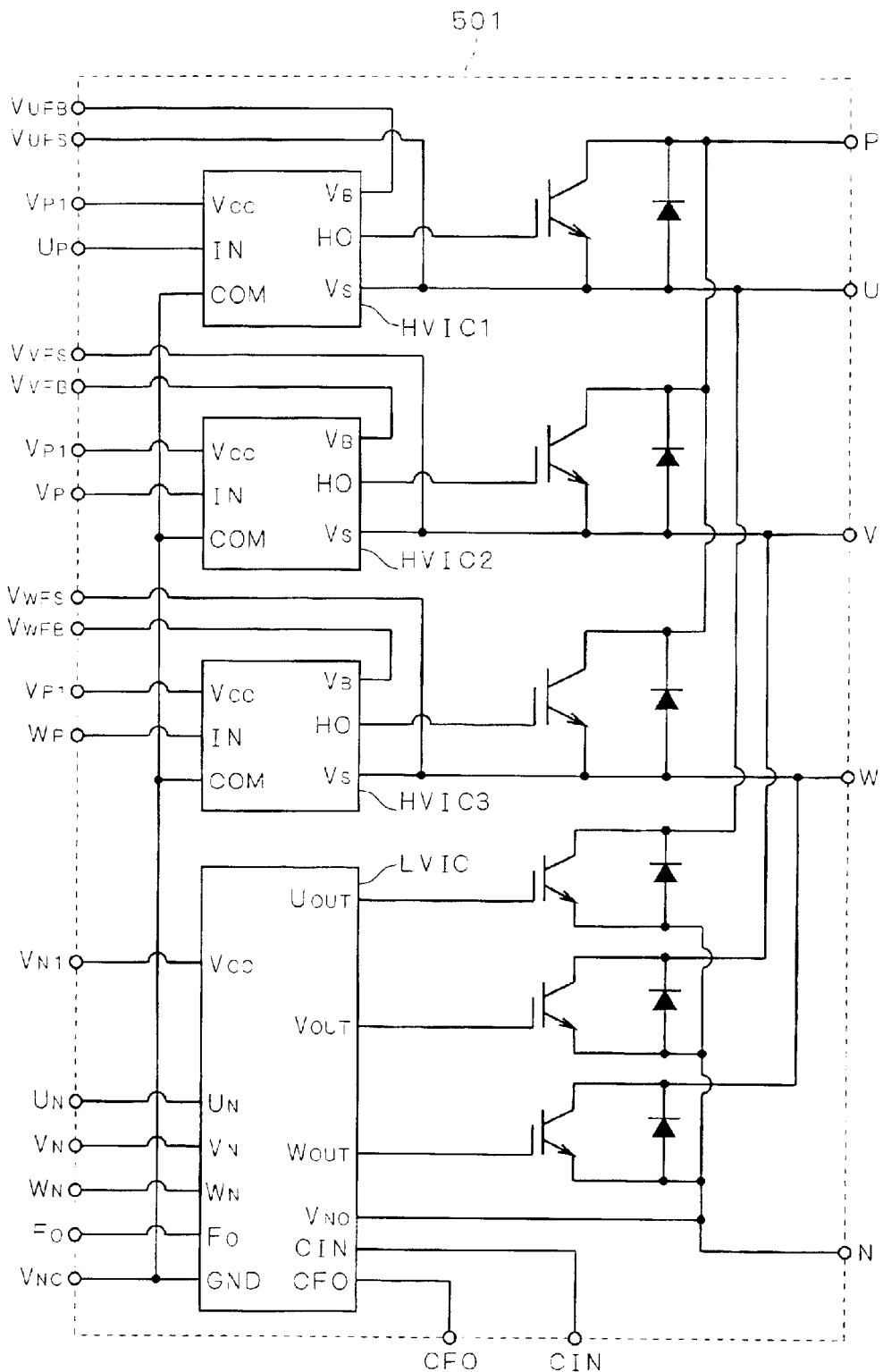
FIG. 24 is a circuit diagram exemplifying the structure of an inverter module in the background art.
Figure 25:
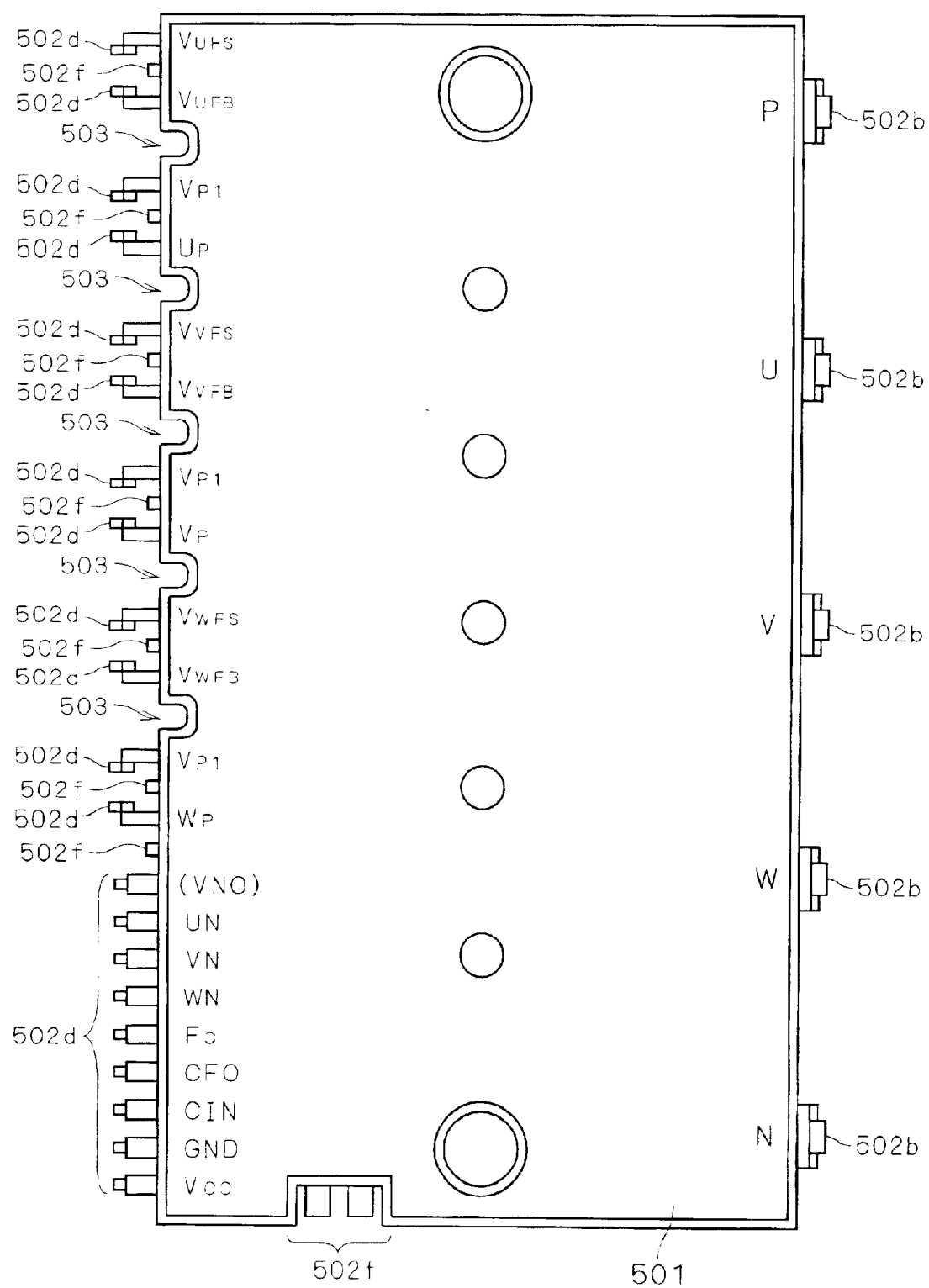
FIG. 25 is an outline view illustrating arrangement of pins of the inverter module in the background art.

FIG. 23 is a circuit diagram describing the foregoing two effects. Those interconnect lines and terminals not to be necessary for the description here are omitted from FIG. 23. The DC power source E1 generally includes a smoothing capacitor 302 and a snubber capacitor 303. These capacitors 302 and 303 are connected in parallel between the lead 221 serving as the high-potential side inverter power source terminal P and the lead 222 as the low-potential side inverter power source terminal N. These parallel-connected capacitors and the leads 221, 222 are connected by interconnect lines (or connection patterns) L1 and L2. The interconnect lines L1 and L2 of long lengths may cause increase in interconnection inductance that is parasitic thereon and raise in surge voltage. However, the leads 221 and 222 are arranged close to each other, or more particularly, adjacent to each other as described above. Therefore, the lengths of the interconnect lines L1 and L2 can be shortened.

The lead 209 serving as the short-circuit detecting terminal CI has connection to a capacitor 301a interposed between the same and the lead 210 serving as the ground terminal $V_{NC}$ and connection to a resistor 301b interposed between the same and the lead 222 serving as the low-potential inverter power source terminal N. The capacitor 301a and the resistor 301b constitute a so-called CR filter 301 to serve as a protection circuit for the short-circuit detecting terminal CI. As described above, the leads 209, 210 and 222 are arranged close to one another. Therefore, inductance of the interconnect lines connecting these leads to the CR filter 301 can be reduced.

Modification

It is preferable that the vicinity of the bottoms of the plurality of terminals on the side of the semiconductor device is coated with an insulating agent regardless of whether these terminals are cut. It is further preferable that the insulating agent is cured. This is because dielectric strength can be improved at this portion.

While the invention has been shown and described in detail, the foregoing description is in all aspects illustrative and not restrictive. It is therefore understood that numerous modifications and variations can be devised without departing from the scope of the invention.

What is claimed is:

1. An inverter module comprising a plurality of terminals arranged along a first direction at a predetermined terminal pitch, said plurality of terminals forming a plurality of rows, wherein said plurality of terminals include:
at least one load side output terminal;
at least one high-potential side control input terminal; and
at least one low-potential side control input terminal, each of said at least one load side output terminal is bent to extend toward a second direction orthogonal to said first direction, and both said at least one high-potential side control input terminal and said at least one low-potential side control input terminal have a distance of three times said terminal pitch or more from said at least one load side output terminal.

2. The inverter module according to claim 1,
wherein both said at least one high-potential side control input terminal and said at least one low-potential side control input terminal bend and extend toward a third direction opposite to said second direction.

3. The inverter module according to claim 1,
wherein said at least one high-potential side control input terminal includes a plurality of high-potential side control input terminals, each of said plurality of high-potential side control input terminals bend and extend toward a third direction opposite to said second direction.

4. The inverter module according to claim 1,
wherein said at least one low-potential side control input terminal includes a plurality of low-potential side control input terminals.

5. The inverter module according to claim 1,
wherein said at least one load side output terminal includes a plurality of load side output terminals.

6. The inverter module according to claim 1, further comprising a plurality of switching control circuits respectively provided in response to a plurality of phases,
wherein said plurality of terminals further include a ground terminal for establishing mutual connection between each ground end of said plurality of switching control circuits.

7. The inverter module according to claim 1, further comprising a plurality of switching control circuits respectively provided in response to a plurality of phases,
wherein said plurality of terminals further include a short-circuit detecting terminal for establishing mutual connection between each short-circuit detecting end of said plurality of switching control circuits.

8. The inverter module according to claim 1,
wherein said plurality of terminals further include at least one bootstrap input terminal, said at least one bootstrap input terminal being bent to extend toward a direction orthogonal to said first direction, and both said at least one high-potential side control input terminal and said at least one low-potential side control input terminal satisfy at least either one of the following conditions:
bending and extending toward a direction opposite to said direction toward which said at least one bootstrap input terminal is bent; and
having a distance of three times said terminal pitch or more from said at least one bootstrap input terminal.

9. The inverter module according to claim 8,
wherein said at least one bootstrap input terminal includes a plurality of bootstrap input terminals.

10. The inverter module according to claim 8,
wherein said at least one high-potential side control input terminal includes a plurality of high-potential side control input terminals, each of said plurality of high-potential side control input terminals satisfying said condition of bending and extending toward a direction opposite to said direction toward which said at least one bootstrap input terminal is bent.

11. The inverter module according to claim 8,
wherein both said at least one high-potential side control input terminal and said at least one low-potential side control input terminal satisfy said condition of bending and extending toward a direction opposite to said direction toward which said at least one bootstrap input terminal is bent.

12. The inverter module according to claim 11,
wherein said at least one low-potential side control input terminal includes a plurality of low-potential side control input terminals, each of said plurality of low-potential side control input terminals satisfying said condition of having a distance of three times said terminal pitch or more from said at least one bootstrap input terminal.

13. The inverter module according to claim 1,
wherein said plurality of terminals further include at least one high-potential side control output terminal arranged between said at least one low-potential side control input terminal and said at least one load side output terminal, and
a tip of said at least one high-potential side control output terminal is cut to a length shorter than tips of both said at least one high-potential side control input terminal and said at least one low-potential side control input terminal.

14. The inverter module according to claim 13,
wherein said at least one low-potential side control input terminal includes a plurality of low-potential side control input terminals.

15. The inverter module according to claim 1, further comprising inverters provided in response to at least one phase,
wherein said plurality of terminals further include:
a high-potential side power source terminal mutually connected to each of said inverters; and
at least one low-potential side power source terminal connected to each of said inverters, and
both said high-potential side power source terminal and said at least one low-potential side power source terminal bend and extend toward a third direction opposite to said second direction.

16. The inverter module according to claim 15,
wherein said at least one low-potential side power source terminal is a single terminal connected to each of said inverters, and
said high-potential side power source terminal and said single terminal are arranged adjacent to each other.

17. The inverter module according to claim 16, further comprising a switching control circuit for controlling switching of one of said inverters,
wherein said plurality of terminals further include:
a short-circuit detecting terminal connected to a short-circuit detecting end of said switching control circuit; and
a ground terminal connected to a ground end of said switching control circuit, and
said short-circuit detecting terminal and said ground terminal are arranged adjacent to each other.

* * * * *